United States Patent
Shimasaki et al.

(10) Patent No.: US 10,453,899 B2
(45) Date of Patent: Oct. 22, 2019

(54) PHOTODETECTOR

(71) Applicant: Panasonic Intellectual Property Management Co., Ltd., Osaka (JP)

(72) Inventors: Naoki Shimasaki, Osaka (JP); Tokuhiko Tamaki, Osaka (JP); Sanshiro Shishido, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 7 days.

(21) Appl. No.: 15/945,790

(22) Filed: Apr. 5, 2018

(65) Prior Publication Data

US 2018/0315798 A1  Nov. 1, 2018

(30) Foreign Application Priority Data

Apr. 26, 2017 (JP) .................................. 2017-086970

(51) Int. Cl.
*H01L 27/30* (2006.01)
*H04N 5/3745* (2011.01)
(Continued)

(52) U.S. Cl.
CPC .............. *H01L 27/307* (2013.01); *G01J 1/44* (2013.01); *G01S 7/4863* (2013.01); *G01S 17/08* (2013.01);
(Continued)

(58) Field of Classification Search
CPC . H01L 27/307; H01L 51/4253; H01L 51/442; H04N 5/3559; H04N 5/37452
See application file for complete search history.

(56) References Cited

U.S. PATENT DOCUMENTS

| | | | |
|---|---|---|---|
| 9,190,449 B2 * | 11/2015 | Kobayashi | ........ H01L 27/14806 |
| 2011/0249163 A1 * | 10/2011 | Ikeda | ................ H01L 27/14609 |
| | | | 348/308 |

(Continued)

FOREIGN PATENT DOCUMENTS

| | | |
|---|---|---|
| JP | 2011-060830 | 3/2011 |
| JP | 2014-127519 | 7/2014 |
| JP | 2017-017583 | 1/2017 |

OTHER PUBLICATIONS

Keita Yasutomi et al., "A 0.3mm-resolution Time-of-Flight CMOS range imager with column-gating clock-skew calibration", ISSCC 2014, Dig. Feb. 2014, pp. 132-134.

*Primary Examiner* — Christine A Enad
(74) *Attorney, Agent, or Firm* — McDermott Will & Emery LLP

(57) ABSTRACT

A photodetector includes: a semiconductor substrate including first and second impurity regions; a gate insulating layer located on a region of the semiconductor substrate, the region being between the first and second impurity regions, the gate insulating layer including a photoelectric conversion layer; a gate electrode located on the gate insulating layer and having a light-transmitting property; a first charge transfer channel transferring signal charges corresponding to a current occurring between the first impurity region and the second impurity region depending on a change in a dielectric constant of the photoelectric conversion layer caused by light incidence on the photoelectric conversion layer; a second charge transfer channel diverging from the first charge transfer channel; a first charge storage storing charges, among the signal charges, transferred via the second charge transfer channel; and a first gate switching transfer and shutdown of charges passing through the second charge transfer channel.

20 Claims, 14 Drawing Sheets

(51) Int. Cl.

| | |
|---|---|
| *H01L 51/42* | (2006.01) |
| *H01L 51/44* | (2006.01) |
| *H04N 5/355* | (2011.01) |
| *G01S 17/08* | (2006.01) |
| *G01J 1/44* | (2006.01) |
| *H01L 27/146* | (2006.01) |
| *H04N 5/374* | (2011.01) |
| *G01S 7/486* | (2006.01) |
| *H01L 27/28* | (2006.01) |
| *H01L 51/00* | (2006.01) |
| *H04N 5/378* | (2011.01) |
| *H04N 5/357* | (2011.01) |
| *H04N 5/359* | (2011.01) |

(52) U.S. Cl.
CPC .......... *H01L 27/146* (2013.01); *H01L 27/283* (2013.01); *H01L 51/4253* (2013.01); *H01L 51/442* (2013.01); *H04N 5/3559* (2013.01); *H04N 5/374* (2013.01); *H04N 5/37452* (2013.01); *G01J 2001/448* (2013.01); *H01L 51/0078* (2013.01); *H04N 5/3572* (2013.01); *H04N 5/3597* (2013.01); *H04N 5/378* (2013.01); *Y02E 10/549* (2013.01)

(56) References Cited

U.S. PATENT DOCUMENTS

| | | | |
|---|---|---|---|
| 2013/0089963 A1* | 4/2013 | Mishima | H01L 27/088 438/301 |
| 2015/0325721 A1 | 11/2015 | Toda | |
| 2016/0006959 A1* | 1/2016 | Machida | H01L 27/14603 348/296 |
| 2017/0006241 A1* | 1/2017 | Shishido | H04N 5/378 |
| 2018/0054579 A1* | 2/2018 | Kumagai | H04N 5/363 |

* cited by examiner

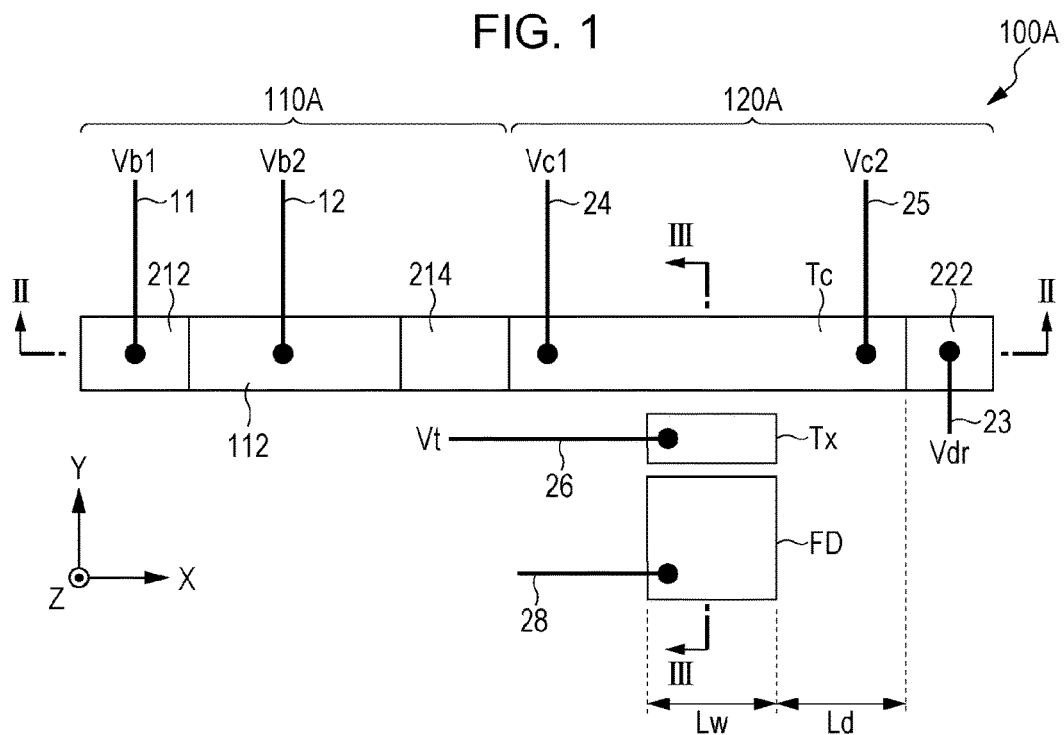
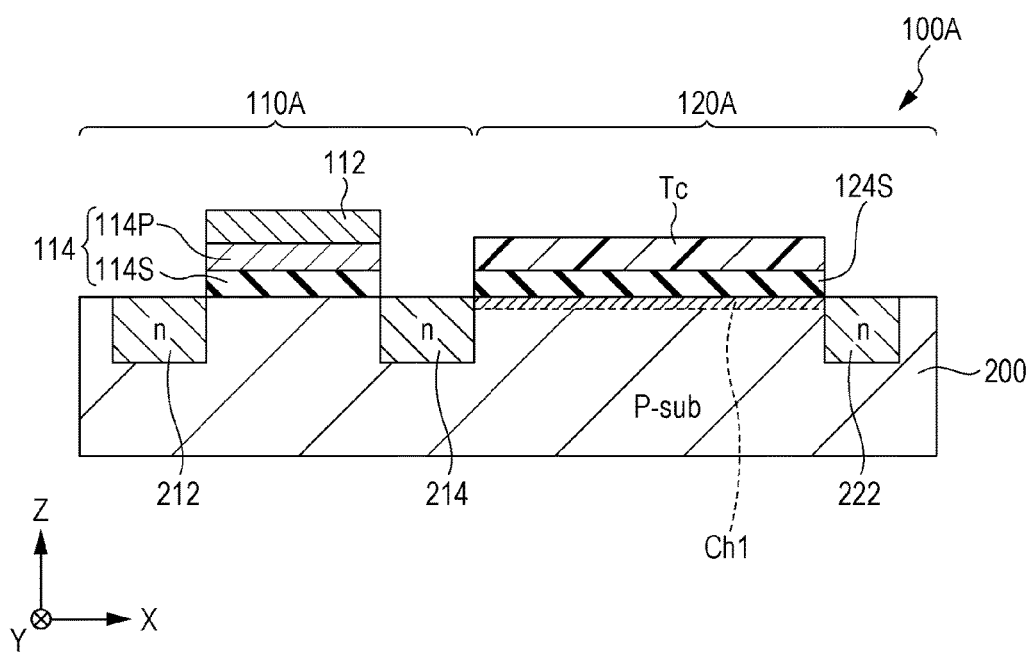

PHOTODETECTOR

BACKGROUND

1. Technical Field

The present disclosure relates to a photodetector.

2. Description of the Related Art

Image pickup devices represented by CMOS image sensors are widely used. In the field of image pickup devices, there are various demands, such as a reduction in noise, expansion of dynamic range, and speeding up of operation.

Japanese Unexamined Patent Application Publication No. 2011-60830 discloses, in FIG. 2, a thin film transistor (TFT) including a gate-insulating film composed of an organic film in which a specified compound is dispersed in an organic polymer. As the specified compound constituting the organic film, a compound changing the state of polarization by light irradiation is selected. In the thin film transistor in this patent document, the gate-insulating film irradiated with light changes the dielectric constant. Accordingly, the current flowing between the source and the drain changes by the irradiation of the gate-insulating film with light. The patent document describes the possibility of such a thin film transistor being applied to a photosensor.

K. Yasutomi, et.al., "A 0.3 mm-resolution Time-of-Flight CMOS range imager with column-gating clock-skew calibration", ISSCC2014, Dig. pp. 132-133 proposes a structure having a discharge gate between a photodiode and a charge discharging drain. In this document, a pixel having such a structure is called a draining-only modulation (DOM) pixel. In the DOM pixel, charges in the photodiode are discharged when the discharge gate is open. When the discharge gate is close, charges in the photodiode can be transferred to floating diffusion. In the DOM pixel, the time resolution is improved by reducing the reset time to substantially zero.

SUMMARY

One non-limiting and exemplary embodiment provides a photodetector having a novel structure.

In one general aspect, the techniques disclosed here feature a photodetector comprising: a semiconductor substrate including a first impurity region and a second impurity region; a gate insulating layer located on a region of the semiconductor substrate, the region being between the first impurity region and the second impurity region, the gate insulating layer including a photoelectric conversion layer; a gate electrode located on the gate insulating layer and having a light-transmitting property; a first charge transfer channel transferring signal charges corresponding to a current occurring between the first impurity region and the second impurity region depending on a change in a dielectric constant of the photoelectric conversion layer caused by light incidence on the photoelectric conversion layer; a second charge transfer channel diverging from the first charge transfer channel; a first charge storage storing charges, among the signal charges, transferred via the second charge transfer channel; and a first gate switching transfer and shutdown of charges passing through the second charge transfer channel.

It should be noted that general or specific embodiments may be implemented as an element, a device, a system, an integrated circuit, a method, or any selective combination thereof.

Additional benefits and advantages of the disclosed embodiments will become apparent from the specification and drawings. The benefits and/or advantages may be individually obtained by the various embodiments and features disclosed in the specification and drawings, which need not all be provided in order to obtain one or more of such benefits and/or advantages.

BRIEF DESCRIPTION OF THE DRAWINGS

FIG. 1 is a plan view schematically illustrating a photodetector according to a first embodiment of the present disclosure;

FIG. 2 is a cross-sectional view along the line II-II in FIG. 1;

DETAILED DESCRIPTION

Figure 3:
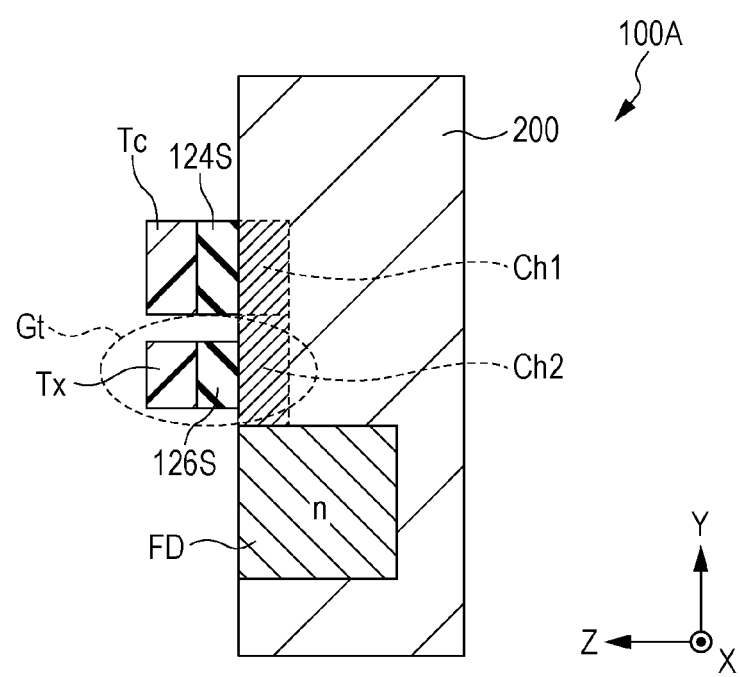
FIG. 3 is a cross-sectional view along the line III-III in FIG. 1.

Aspects of the present disclosure are summarized as follows.

Aspect 1

A photodetector comprising:

a semiconductor substrate including a first impurity region and a second impurity region;

a gate insulating layer located on a region of the semiconductor substrate, the region being between the first impurity region and the second impurity region, the gate insulating layer including a photoelectric conversion layer;

a gate electrode located on the gate insulating layer and having a light-transmitting property;

a first charge transfer channel transferring signal charges corresponding to a current occurring between the first impurity region and the second impurity region depending on a change in a dielectric constant of the photoelectric conversion layer caused by light incidence on the photoelectric conversion layer;

a second charge transfer channel diverging from the first charge transfer channel;

a first charge storage storing charges, among the signal charges, transferred via the second charge transfer channel; and a first gate switching transfer and shutdown of charges passing through the second charge transfer channel.

According to the structure of Aspect 1, charges corresponding to the amount of light irradiated for a predetermined period of time can be transferred to a charge storage, and photodetection in a desired time window is possible by reading out the charges stored in the charge storage.

Aspect 2

The photodetector according to Aspect 1, wherein the gate insulating layer includes an insulating layer between the photoelectric conversion layer and the semiconductor substrate.

According to the structure of Aspect 2, charge exchange between the photoelectric conversion layer and the semiconductor substrate can be suppressed.

Aspect 3

The photodetector according to Aspect 1 or 2, further comprising a light shielding film between the gate electrode and the semiconductor substrate.

According to the structure of Aspect 3, stray light is suppressed from entering the impurity regions in the semiconductor substrate and the channels to suppress mixing of noise caused by incidence of stray light.

Aspect 4

The photodetector according to any one of Aspects 1 to 3, wherein the photoelectric conversion layer has a photocurrent characteristic between a bias voltage applied to the photoelectric conversion layer and an current density of a current flowing through the photoelectric conversion layer, the photocurrent characteristic including a first voltage range where an absolute value of the current density increases as the bias voltage increases in a reverse direction, a second voltage range where the current density increases as the bias voltage increases in a forward direction, and a third voltage range where an absolute value of a rate of change of the current density relative to bias voltage is less than in the first voltage range and the second voltage range, the third voltage range being between the first voltage range and the second voltage range.

Aspect 5

The photodetector according to Aspect 4, further comprising:

a voltage supply circuit supplying a voltage that falls within the third voltage range when a voltage of the first impurity region is regarded as a standard, to the gate electrode, wherein the current occurs between the first impurity region and the second impurity region in a state where a potential difference between the first impurity region and the gate electrode is maintained within the third voltage range.f.

According to the structure of Aspect 5, discharge of charges from the photoelectric conversion layer or inflow of charges into the photoelectric conversion layer is not caused. Accordingly, for example, noise and afterimage are suppressed from occurring in application of the photodetector to an image sensor.

Aspect 6

The photodetector according to Aspect 4, further comprising:

a voltage supply circuit, wherein the voltage supply circuit supplies a voltage to the gate electrode such that a bias voltage that falls within the third voltage range is applied to the photoelectric conversion layer; and the current occurs between the first impurity region and the second impurity region in a state where the bias voltage applied to the photoelectric conversion layer is maintained within the third voltage range.

Aspect 7

The photodetector according to any one of Aspects 1 to 6 further comprising:

a voltage supply circuit, wherein the semiconductor substrate includes a third impurity region;

one end of the first charge transfer channel is connected to the second impurity region, and the other end of the first charge transfer channel is connected to the third impurity region; and the voltage supply circuit supplies a voltage different from a voltage of the first impurity region to the third impurity region.

Aspect 8

A photodetector comprising:

a semiconductor substrate including a first impurity region and a second impurity region;

a gate insulating layer located on a region of the semiconductor substrate, the region being between the first impurity region and the second impurity region;

a gate electrode on the gate insulating layer;

a first electrode electrically connected to the gate electrode;

a second electrode facing the first electrode and having a light-transmitting property;

a photoelectric conversion layer between the first electrode and the second electrode;

a first charge transfer channel transferring signal charges corresponding to a current occurring between the first impurity region and the second impurity region depending on a change in a dielectric constant between the first electrode and the second electrode caused by light incidence on the photoelectric conversion layer;

a second charge transfer channel diverging from the first charge transfer channel;

a first charge storage storing charges, among the signal charges, transferred via the second charge transfer channel; and a first gate switching transfer and shutdown of charges passing through the second charge transfer channel.

According to the structure of Aspect 8, charges corresponding to the amount of light irradiated for a predetermined period of time can be transferred to a charge storage, and photodetection in a desired time window is possible by reading out the charges stored in the charge storage.

Aspect 9

The photodetector according to Aspect 8, wherein the photoelectric conversion layer has a photocurrent characteristic between a bias voltage applied to the photoelectric conversion layer and an current density of a current flowing through the photoelectric conversion layer, the photocurrent characteristic including a first voltage range where an absolute value of the current density increases as the bias voltage increases in a reverse direction, a second voltage range where the output current density increases as the bias voltage increases in a forward direction, and a third voltage range where an absolute value of a rate of change of the current density relative to bias voltage is less than in the first voltage range and the second voltage range, the third voltage range being between the first voltage range and the second voltage range.

Aspect 10

The photodetector according to Aspect 8 or 9, further comprising:

a first insulating layer between the first electrode and the photoelectric conversion layer and/or a second insulating layer between the photoelectric conversion layer and the second electrode.

According to the structure of Aspect 10, a larger potential difference can be applied between both main surfaces of the photoelectric conversion layer.

Aspect 11

The photodetector according to Aspect 9 or 10, further comprising:

a voltage supply circuit supplying a voltage that falls within the first voltage range when a voltage of the first impurity region is regarded as a standard, to the second electrode, wherein the current occurs between the first impurity region and the second impurity region in a state where a potential difference between the first impurity region and the second electrode is maintained within the first voltage range.

Aspect 12

The photodetector according to Aspect 9 or 10, further comprising:

a voltage supply circuit supplying a voltage that falls within the third voltage range when a voltage of the first impurity region is regarded as a standard, to the second electrode, wherein the current occurs between the first impurity region and the second impurity region in a state where a potential difference between the first impurity region and the second electrode is maintained within the third voltage range.

According to the structure of Aspect 12, discharge of charges from the photoelectric conversion layer or inflow of charges into the photoelectric conversion layer is not caused. Accordingly, for example, noise and afterimage are suppressed from occurring in application of the photodetector to an image sensor.

Aspect 13

The photodetector according to Aspect 9 or 10, further comprising:

a voltage supply circuit, wherein the voltage supply circuit supplies a voltage to the second electrode such that a bias voltage that falls within the third voltage range is applied to the photoelectric conversion layer; and the current occurs between the first impurity region and the second impurity region in a state where the bias voltage applied to the photoelectric conversion layer is maintained within the third voltage range.

Aspect 14

The photodetector according to any one of Aspects 8 to 13, wherein the first electrode has a light-shielding property.

According to the structure of Aspect 14, stray light is suppressed from entering the impurity regions in the semiconductor substrate and the channels to suppress mixing of noise caused by incidence of stray light.

Aspect 15

The photodetector according to any one of Aspects 8 to 14, further comprising a junction connecting between the gate electrode and the first electrode.

According to the structure of Aspect 15, a higher aperture ratio can be readily obtained compared to the structure having the photoelectric conversion layer on the side of the charge transfer channel.

Aspect 16

The photodetector according to any one of Aspects 1 to 15, further comprising:

a third charge transfer channel diverging from the first charge transfer channel; and a second charge storage storing charges, among the signal charges, transferred via the third charge transfer channel.

According to the structure of Aspect 16, charges can be distributed to each of the plurality of charge storages depending on the movement distance in the first charge transfer channel.

Aspect 17

The photodetector according to Aspect 16, further comprising:

a second gate switching transfer and shutdown of charges passing through the third charge transfer channel, wherein the first gate and the second gate each independently switch transfer and shutdown of charges.

According to the structure of Aspect 17, charge transfer to the respective charge storages can be independently controlled.

Aspect 18

The photodetector according to any one of Aspects 8 to 17, further comprising:

a voltage supply circuit, wherein the semiconductor substrate includes a third impurity region;

one end of the first charge transfer channel is connected to the second impurity region, and the other end of the first charge transfer channel is connected to the third impurity region; and the voltage supply circuit supplies a voltage different from a voltage of the first impurity region to the third impurity region.

Embodiments of the present disclosure will now be described in detail with reference to the drawings. The embodiments described later are all inclusive or specific examples. The numerical values, shapes, materials, components, arrangement and connection forms of components, steps, the order of steps, etc. shown in the following embodiments are merely examples and are not intended to limit the present disclosure. The various aspects described in the specification can be combined with each other as long as there is no inconsistency. Among the components in the following embodiments, the components not described in the independent claim showing the highest concept are described as optional components. In the following description, components having substantially the same functions are denoted by common reference numerals, and the explanation thereof may be omitted.

First Embodiment

FIGS. 1 to 3 illustrate a photodetector according to a first embodiment of the present disclosure. FIG. 2 is a cross-sectional view along the line II-II in FIG. 1. FIG. 3 is a cross-sectional view along the line III-III in FIG. 1. For reference, FIGS. 1 to 3 show arrows indicating X-direction, Y-direction, and Z-direction orthogonal to one another.

Other drawings also may show arrows indicating X-direction, Y-direction, or Z-direction. FIGS. 1 to 3 schematically illustrate an arrangement of each part constituting the photodetector, and the dimension of each part illustrated in these drawings do not necessarily strictly reflect the dimension of an actual device. This also applies to other drawings of the present disclosure.

The photodetector 100A illustrated in FIGS. 1 to 3 includes a photoelectric conversion structure 110A and a charge transfer structure 120A. As schematically illustrated in FIG. 2, the photoelectric conversion structure 110A and the charge transfer structure 120A are supported by a semiconductor substrate 200. The "semiconductor substrate" in the specification is not limited to a substrate of which the whole is a semiconductor, and may be, for example, a substrate composed of an insulating support and a semiconductor layer disposed on the support. A p-type silicon substrate is shown below as an example of the semiconductor substrate 200.

The semiconductor substrate 200 includes impurity regions 212, 214, and 222 formed near its surface. As schematically illustrated in FIGS. 2 and 3, herein, the impurity regions 212, 214, and 222 are n-type regions. The impurity regions 212 and 214 among these impurity regions constitute a part of the photoelectric conversion structure 110A.

The photoelectric conversion structure 110A further includes a transparent gate electrode 112 and a gate insulating layer 114. As illustrated in FIGS. 1 and 2, the transparent gate electrode 112 and the gate insulating layer 114 are located on the semiconductor substrate 200 in a region between the impurity regions 212 and 214.

In the case of using the photodetector 100A as an infrared detection device, the material of the transparent gate electrode 112 can be a transparent conductive oxide (TCO) having a high transmittance for near-infrared light and a low resistance value. Examples of the TCO include ITO, IZO, AZO, FTO, $SnO_2$, $TiO_2$, and $ZnO_2$. The transparent gate electrode 112 may be a thin film of a metal such as Au. The term "transparent" in the specification means that light in the wavelength range to be detected is at least partially transmitted, and does not require that light is transmitted throughout the wavelength range of visible light.

The gate insulating layer 114 includes a photoelectric conversion layer 114P as a part thereof and is located between the transparent gate electrode 112 and the semiconductor substrate 200. In this example, the gate insulating layer 114 further includes an insulating layer 114S between the photoelectric conversion layer 114P and the semiconductor substrate 200.

As schematically illustrated in FIG. 1, the impurity region 212 is connected to a first voltage line 11, and the transparent gate electrode 112 is connected to a second voltage line 12. The first voltage line 11 and the second voltage line 12 are connected to power sources (not shown). In order to avoid complexity, in FIGS. 2 and 3, the illustration of the first voltage line 11 and the second voltage line 12 is omitted. Thus, in the drawings of the present disclosure, a part of components, such as wiring, may be omitted from being illustrated.

During operation of the photodetector 100A, the first voltage line 11 supplies a predetermined first bias voltage Vb1 to the impurity region 212, and the second voltage line 12 supplies a predetermined second bias voltage Vb2 to the transparent gate electrode 112. The second bias voltage Vb2 is typically a voltage having a magnitude similar to the first bias voltage Vb1. The first bias voltage Vb1 can be a power source voltage.

The photoelectric conversion structure 110A irradiated with light causes movement of charges corresponding to the amount of the irradiated light between the impurity region 212 and the impurity region 214. In other words, the photoelectric conversion structure 110A is structured so as to be capable of generating a current corresponding to the amount of irradiated light as a signal indicating a change with time in light irradiated to the photodetector 100A. The structure and operation principle of the photoelectric conversion structure 110A will be described in detail later.

The charge transfer structure 120A is electrically connected to the photoelectric conversion structure 110A. In the structure illustrated in FIGS. 1 to 3, the charge transfer structure 120A is electrically connected to the photoelectric conversion structure 110A via the impurity region 214. In other words, the impurity region 214 is shared between the charge transfer structure 120A and the photoelectric conversion structure 110A.

The charge transfer structure 120A includes at least one charge storage FD capable of temporarily holding charges. As schematically illustrated in FIG. 3, in this example, the charge storage FD is formed as an n-type impurity region in the semiconductor substrate 200. The impurity concentrations in the impurity regions 212, 214, and 222 and the charge storage FD need not be the same and can be appropriately adjusted. As described in detail later, the charge transfer structure 120A selectively extract the charges corresponding to the amount of irradiated light in a predetermined period of time to the charge storage FD, based on the current generated in the photoelectric conversion structure 110A. Photodetection in a desired time window is possible by transferring the charges corresponding to the amount of irradiated light in a predetermined period of time to the charge storage FD and reading out the charges held in the charge storage FD.

In the structure illustrated in FIGS. 1 to 3, the charge transfer structure 120A includes the impurity region 222. In this example, the impurity region 222 is disposed apart from the impurity region 214 along the X-direction. The impurity region 222 is connected to a third voltage line 23 connected to a power source (not shown). During operation of the photodetector 100A, the potential of the impurity region 222 is fixed by receiving a supply of a predetermined reference voltage Vdr via the third voltage line 23.

The charge transfer structure 120A includes a layered structure of an insulating layer 124S and a control electrode Tc disposed on the semiconductor substrate 200 in a region between the impurity region 214 and the impurity region 222. The control electrode Tc is located on the insulating layer 124S disposed on the semiconductor substrate 200. The control electrode Tc is typically composed of polysilicon provided with conductivity by impurity doping. The insulating layer 124S is, for example, a silicon dioxide layer. The insulating layer 114S in the photoelectric conversion structure 110A and the insulating layer 124S in the charge transfer structure 120A can have the same layer structure. In other words, the insulating layer 114S in the photoelectric conversion structure 110A can be a silicon dioxide layer having the same thickness as that of the insulating layer 124S in the charge transfer structure 120A. As the insulating layer 114S and/or the insulating layer 124S, a silicon oxynitride film, which is generally used in a silicon semiconductor, may be used, or a high-k film, such as a $HfO_2$ film, may be used. The thicknesses of these insulating layers may be appropriately set according to the material.

The control electrode Tc is structured so as to be capable of forming an inversion layer in the semiconductor substrate 200 in a region between the impurity region 214 and the impurity region 222 by application of an appropriate voltage. Herein, a fourth voltage line 24 connected to a power source (not shown) is connected to the control electrode Tc at a position near the end adjacent to the impurity region 214, and a fifth voltage line 25 connected to a power source (not shown) is connected to the control electrode Tc at a position near the end adjacent to the impurity region 222. During operation of the photodetector 100A, the fourth voltage line 24 supplies a first control voltage Vc1 to the control electrode Tc, and the fifth voltage line 25 supplies a second control voltage Vc2 to the control electrode Tc. That is, in this example, the control electrode Tc is structured such that a first control voltage Vc1 and a second control voltage Vc2 can be applied to the end on the impurity region 212 side and the end on the impurity region 222 side, respectively. The fourth voltage line 24 and the fifth voltage line 25 need not be connected to a common power source. The fourth voltage line 24 and the fifth voltage line 25 may be independently connected to the respective power sources.

It is possible to form an inversion layer in the semiconductor substrate 200 at a portion under the control electrode Tc by appropriately controlling the potential of the control electrode Tc via the fourth voltage line 24 and the fifth voltage line 25. The inversion layer formed in the semiconductor substrate 200 so as to connect between the impurity region 214 and the impurity region 222 by controlling the potential of the control electrode Tc can function as, for example, a channel for transferring charges from the impurity region 222 toward the impurity region 214. Hereinafter, the channel responsible for charge transfer between the impurity region 222 and the impurity region 214 is called first charge transfer channel Ch1. The first charge transfer channel Ch1 constitutes a part of the charge transfer structure 120A.

The impurity region 222 and the impurity region 214 define the positions of both ends of the first charge transfer channel Ch1. In this example, the impurity region 222 and the impurity region 214 are arranged with an interval in the X-direction of the drawing, and thereby the control electrode Tc linearly extends along the X-direction from the position of the impurity region 214 to the position of the impurity region 222. Although the first charge transfer channel Ch1 is linear in the example illustrated in FIGS. 1 and 2, the shape of the first charge transfer channel Ch1 is not limited to this example. The first charge transfer channel Ch1 may include, for example, a bending and/or curved portion. The impurity region 212, the impurity region 222, and the impurity region 214 are not necessarily arranged in a linear form.

The first control voltage Vc1 and the second control voltage Vc2 are voltages each having a magnitude that can form an inversion layer functioning as a charge transfer channel in the semiconductor substrate 200 in a region between the impurity region 214 and the impurity region 222. Each of the first control voltage Vc1 and the second control voltage Vc2 is typically a voltage between the first bias voltage Vb1 and the reference voltage Vdr applied to the third voltage line 23.

The charge transfer structure 120A further includes at least one second charge transfer channel Ch2 diverging from the first charge transfer channel Ch1. As schematically illustrated in FIG. 3, in this example, the charge transfer structure 120A includes a second charge transfer channel Ch2 connecting between the first charge transfer channel Ch1 and the charge storage FD formed apart from the first charge transfer channel Ch1 along the Y-direction, in addition to the first charge transfer channel Ch1.

As can be seen by referring to FIGS. 1 and 3, in this example, the charge transfer structure 120A includes a transfer gate electrode Tx located between the first charge transfer channel Ch1 and the charge storage FD. As schematically illustrated in FIG. 3, the transfer gate electrode Tx is located on the insulating layer 126S disposed on the semiconductor substrate 200. The insulating layer 126S can have the same layer structure as that of the insulating layer 114S and/or the insulating layer 124S. The transfer gate electrode Tx is formed of, for example, a metal, such as aluminum and copper, a metal nitride, or polysilicon and can have the same layer structure as that of the control electrode Tc.

As illustrated in FIG. 1, the transfer gate electrode Tx is connected to a gate control line 26 connected to a voltage supply circuit described later. The potential of the transfer gate electrode Tx is controlled by the gate control voltage Vt supplied from the voltage supply circuit via the gate control line 26. For example, an inversion layer can be formed in the semiconductor substrate 200 at a portion under the transfer gate electrode Tx by supplying a high-level gate control voltage Vt to the transfer gate electrode Tx. The inversion layer formed under the transfer gate electrode Tx can function as a channel for transferring charges from the first charge transfer channel Ch1 to the charge storage FD. At least a part of the charges moving in the first charge transfer channel Ch1 can be transferred toward the charge storage FD by forming a channel between the first charge transfer channel Ch1 and the charge storage FD. Herein, the second charge transfer channel Ch2 can be defined as a channel responsible for transferring charges between the first charge transfer channel Ch1 and the charge storage FD.

The transfer of charges from the first charge transfer channel Ch1 to the charge storage FD is stopped by supplying a low-level gate control voltage Vt to the transfer gate electrode Tx. In this example, the region of the semiconductor substrate 200 between the first charge transfer channel Ch1 and the charge storage FD, the insulating layer 126S above the region, and the transfer gate electrode Tx above the region constitute a gate Gt that switches transfer and shutdown of charges to the charge storage FD from the second charge transfer channel Ch2. The open and close of the gate Gt is controlled using the gate control voltage Vt. Accordingly, in this example, the open and close of the second charge transfer channel Ch2 is controlled electrically.

The charge storage FD has a function of temporarily storing the charge transferred from the first charge transfer channel Ch1 via the second charge transfer channel Ch2. As illustrated in FIG. 1, the charge storage FD is connected to a reading line 28. The reading line 28 is connected to a signal detection circuit (not shown) including a signal detection transistor and so on. The signal detection circuit reads out a signal corresponding to the amount of charges stored in the charge storage FD.

Figure 4:
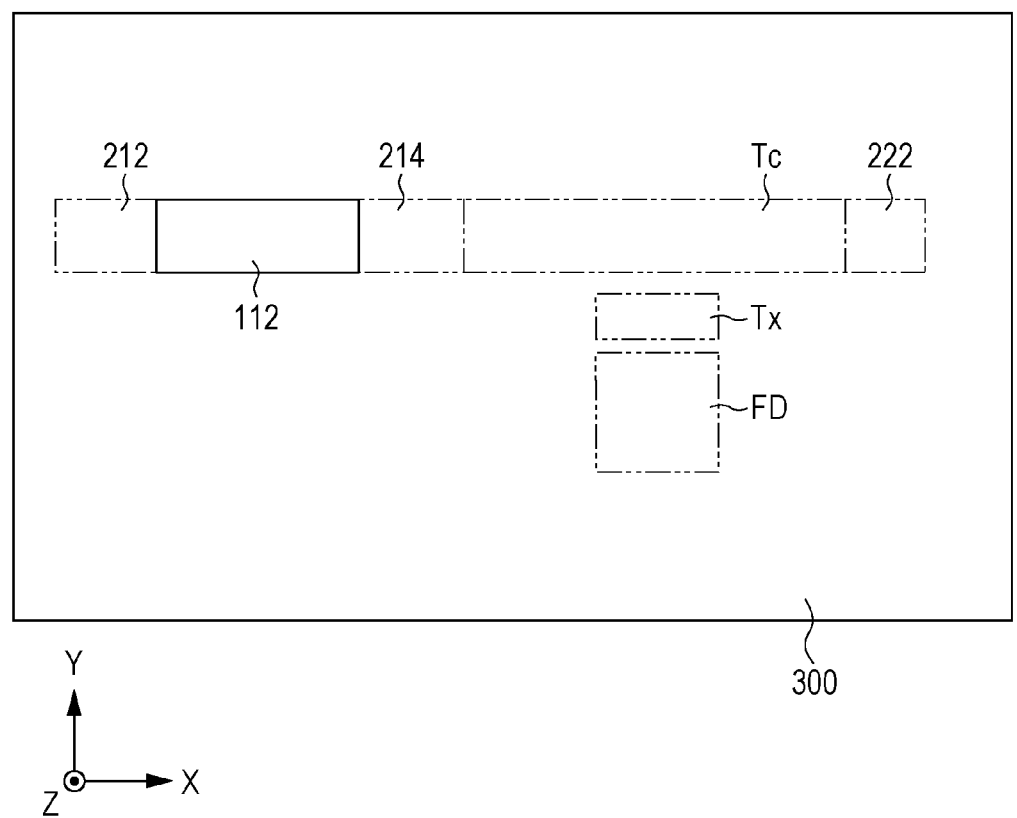
FIG. 4 is a plan view illustrating an example of a structure including a light shielding film covering the portion excluding the transparent gate electrode.

The photodetector 100A can include a light shielding film 300, which is not shown in FIGS. 1 to 3, on the transparent gate electrode 112 side so as to cover the portion excluding the transparent gate electrode 112 as illustrated in FIG. 4. In such a structure, in the surface of the photodetector 100A on the transparent gate electrode 112 side, the portion where the transparent gate electrode 112 is located corresponds to the light receiving section of the photodetector 100A. The transparent gate electrode 112 may have any shape viewed from the normal direction of the semiconductor substrate 200.

The light shielding film 300 is disposed, for example, between the semiconductor substrate 200 and the transparent gate electrode 112 in the Z-direction. The light shielding film 300 can be formed on or above the semiconductor substrate 200 so as to cover the impurity regions 212, 214, and 222 and the charge storage FD. The light shielding film 300 may be constituted of a wiring layer positioned upper than the semiconductor substrate 200. The control electrode Tc and the transfer gate electrode Tx may constitute a part of the light shielding film 300. By covering the surface receiving light incidence, excluding the transparent gate electrode 112, with the light shielding film 300, stray light is suppressed from entering the impurity regions formed in the semiconductor substrate 200 and, for example, components, such as channels, formed in the region below the control electrode Tc. Mixing of noise can be suppressed by suppressing stray light from entering the impurity regions in the semiconductor substrate 200 and the channels. Among the light transmitted through the transparent gate electrode 112, the light traveling toward the photoelectric conversion layer 114P can be mostly absorbed by the photoelectric conversion layer 114P.

Photodetection Operation

A typical example of operation in the photodetector 100A will now be described.

For simplicity, a state in which the photodetector 100A is not irradiated with light is assumed. In detection of light, a first bias voltage Vb1 is applied to the impurity region 212 of the photoelectric conversion structure 110A. The first voltage line 11 supplies, for example, a voltage of 3.3 V as the first bias voltage Vb1 to the impurity region 212. A second bias voltage Vb2 is applied to the transparent gate electrode 112 of the photoelectric conversion structure 110A. The second voltage line 12 supplies, as the second bias voltage Vb2, a voltage that falls within a predetermined voltage range when a voltage of the impurity region 212 is regarded as a standard, to the transparent gate electrode 112. Herein, the second bias voltage Vb2 is a voltage substantially equal to the first bias voltage Vb1.

The charge transfer structure 120A is focused on. In detection of light, a reference voltage Vdr is applied to the impurity region 222. The reference voltage Vdr herein is lower than the first bias voltage Vb1. For example, a voltage of 0 V is applied to the impurity region 222 via the third voltage line 23. A low-level gate control voltage Vt is supplied to the transfer gate electrode Tx from the gate control line 26 to switch the gate Gt off.

Subsequently, it is assumed that the photodetector 100A is irradiated with light in a state in which predetermined voltages are respectively applied to the impurity region 212 and the transparent gate electrode 112 of the photoelectric conversion structure 110A and the impurity region 222 and the transfer gate electrode Tx of the charge transfer structure 120A. Among the irradiated light, the light passed through the transparent gate electrode 112 enters the photoelectric conversion layer 114P.

The light incidence on the photoelectric conversion layer 114P causes generation of a pair of positive and negative charges inside the photoelectric conversion layer 114P. The pair of positive and negative charges is typically an electron-hole pair. On this occasion, a state in which outflow of charges from the photoelectric conversion layer 114P to the outside and inflow of charges into the photoelectric conversion layer 114P from the outside does not occur can be achieved by supplying a second bias voltage Vb2 within an appropriate voltage range when a voltage of the impurity region 212 is regarded as a standard, to the transparent gate electrode 112. Herein, the first bias voltage Vb1 selected is 3.3 V, and the second bias voltage Vb2 selected is around 3.3 V. Accordingly, it is possible to achieve a state in which the potential difference applied between the main surface of the photoelectric conversion layer 114P on the semiconductor substrate 200 side and the main surface of the photoelectric conversion layer 114P on the transparent gate electrode 112 side is almost 0 V. In such a state, the movement of charges from the photoelectric conversion layer 114P to the transparent gate electrode 112 and the movement of charges from the transparent gate electrode 112 to the photoelectric conversion layer 114P are suppressed. In this example, since an insulating layer 114S lies between the photoelectric conversion layer 114P and the semiconductor substrate 200, no charge exchange occurs between the photoelectric conversion layer 114P and the semiconductor substrate 200.

When light enters the photoelectric conversion layer 114P in a state in which the bias voltage applied between both main surfaces of the photoelectric conversion layer 114P is appropriately controlled, for example, in a state in which the bias voltage is around 0 V, the dipole moment of each charge pair generated by photoelectric conversion can be oriented in substantially the same direction. Herein, the vicinity of the interface between the photoelectric conversion layer 114P and the transparent gate electrode 112 is focused on. The intensity E of the electric field in the photoelectric conversion layer 114P being applied with a predetermined bias voltage and being irradiated with light satisfies $E=((\sigma_f-\sigma_p)/\varepsilon_0)$ and $E=(\sigma_f/\varepsilon)$, according to the Gauss's law. In the expressions, $\sigma_f$ represents the charge density in the transparent gate electrode 112; $\varepsilon_p$ represents the density of charges generated by polarization on the surface of the photoelectric conversion layer 114P facing the transparent gate electrode 112; and $\varepsilon_0$ ands represent the dielectric constant of vacuum and the dielectric constant of the photoelectric conversion layer 114P, respectively. The expressions $E=((\sigma_f-\sigma_p)/\varepsilon_0)$ and $E=((\sigma_f/\varepsilon)$ give $\varepsilon=\varepsilon_0(\sigma_f/(\sigma_f-\sigma_p))$, which demonstrates that the dielectric constant of the photoelectric conversion layer 114P is increased by an increase in charge contributing to polarization, for example, an increase in electron-hole pairs. That is, an increase of charges contributing to polarization by irradiating the photoelectric conversion layer 114P with light increases the dielectric constant of the photoelectric conversion layer 114P, resulting in an increase in the dielectric constant of the whole gate insulating layer 114.

As shown in FIG. 2, the photoelectric conversion structure 110A has a structure similar to that of a field effect transistor expect that the gate insulating layer 114 includes a photoelectric conversion layer 114P. When the photoelectric conversion structure 110A is compared to a field effect transistor, the impurity region 212 corresponds to one of the source region and the drain region of the field effect transistor, and the impurity region 214 corresponds to the other of the source region and the drain region.

In a field effect transistor, an increase in the dielectric constant of the gate insulating layer causes the threshold voltage to be decreased, or causes the effective gate voltage to be increased. Accordingly, in the photoelectric conversion structure 110A, an increase in the dielectric constant of the photoelectric conversion layer 114P by incidence of light is accompanied by an increase in the dielectric constant of the whole gate insulating layer 114, which causes the same effect as that caused by a decrease in the threshold voltage in the field effect transistor, resulting in a formation of a channel between the impurity regions 212 and 214.

The potential of the impurity region 214 is focused on. Although the potential of the impurity region 212 is 3.3 V by the supply of the first bias voltage Vb1, the potential of the impurity region 214 is a floating potential. Herein, it is assumed that a first control voltage Vc1 and a second control voltage Vc2 are applied via the fourth voltage line 24 and the fifth voltage line 25, respectively, to the control electrode Tc to form an inversion layer in the semiconductor substrate 200 at a portion under the control electrode Tc. For example, a first control voltage Vc1 of 1.5 V and a second control voltage Vc2 of 1.5 V are applied to the control electrode Tc. The formation of an inversion layer forms a channel connecting between the impurity region 214 and the impurity region 222 in the semiconductor substrate 200.

The formation of channels allowing movement of charges between the impurity region 222 and the impurity region 214 and between the impurity region 214 and the impurity region 212 electrically connects between the impurity region 212 of the photoelectric conversion structure 110A and the impurity region 222 of the charge transfer structure 120A. As described above, herein, the reference voltage Vdr applied to the impurity region 222 is 0 V, which is lower than the voltage, 3.3 V, applied to the impurity region 212 of the photoelectric conversion structure 110A. Accordingly, the formation of these channels causes a flow of electrons from the impurity region 222 toward the impurity region 212 as a whole. In other words, a current flow from the impurity region 212 toward the impurity region 222 occurs.

On this occasion, the intensity of the current flowing between the impurity region 212 and the impurity region 214 of the photoelectric conversion structure 110A depends on the degree of decrease in the threshold voltage when the photoelectric conversion structure 110A is regarded as a field effect transistor, i.e., the degree of increase in the dielectric constant of the photoelectric conversion layer 114P. In other words, a current corresponding to the amount of light incident on the photoelectric conversion layer 114P occurs between the impurity region 212 and the impurity region 214 of the photoelectric conversion structure 110A. Accordingly, the potential of the impurity region 214 changes within a voltage range of 0 to 3.3 V depending on the amount of light incident on the photoelectric conversion layer 114P. The potential of the impurity region 214 increases with an increase in illuminance.

Thus, the potential of the impurity region 214 changes depending on the amount of light incident on the photoelectric conversion layer 114P. Consequently, the voltage difference between the impurity region 214 and the impurity region 222 changes depending on the amount of light incident on the photoelectric conversion layer 114P. As a result, movement of charges occurs between the impurity region 214 and the impurity region 222 depending on the amount of light incident on the photoelectric conversion layer 114P. Hereinafter, the charge moving between the impurity region 222 and the impurity region 214 via the first charge transfer channel Ch1 may be conveniently called "signal charge". In this example, the electron that moves in the first charge transfer channel Ch1 from the impurity region 222 toward the impurity region 214 is the signal charge.

Light can be detected by detecting the movement of charges occurring between the impurity region 212 and the impurity region 222 by light irradiation as a change in, for example, voltage or current. In a typical embodiment of the present disclosure, at least a part of the signal charges transferred in the first charge transfer channel Ch1 from the impurity region 222 toward the impurity region 214 is further temporarily extracted in the charge storage FD via the second charge transfer channel Ch2, and the charges transferred to the charge storage FD are read out. Photodetection in a desired time window is possible by transferring at least a part of the signal charges moving in the first charge transfer channel Ch to the charge storage FD and reading out the transferred charges. This point will now be described.

Figure 5:
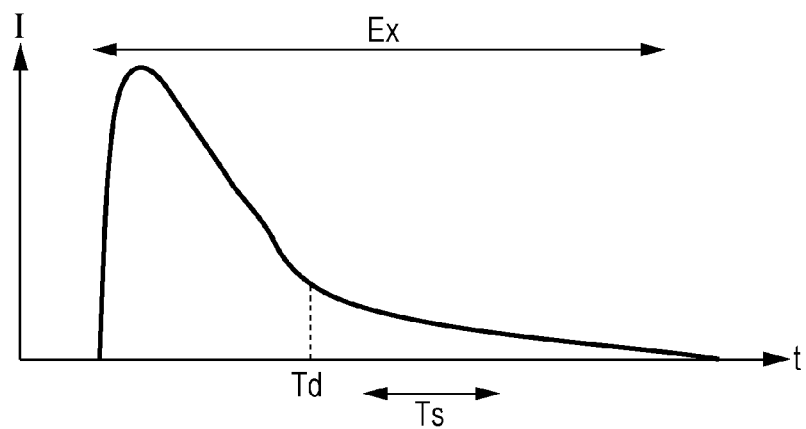
FIG. 5 is a graph showing an example of a change with time in the intensity of light incident on the photodetector.
Figure 6:
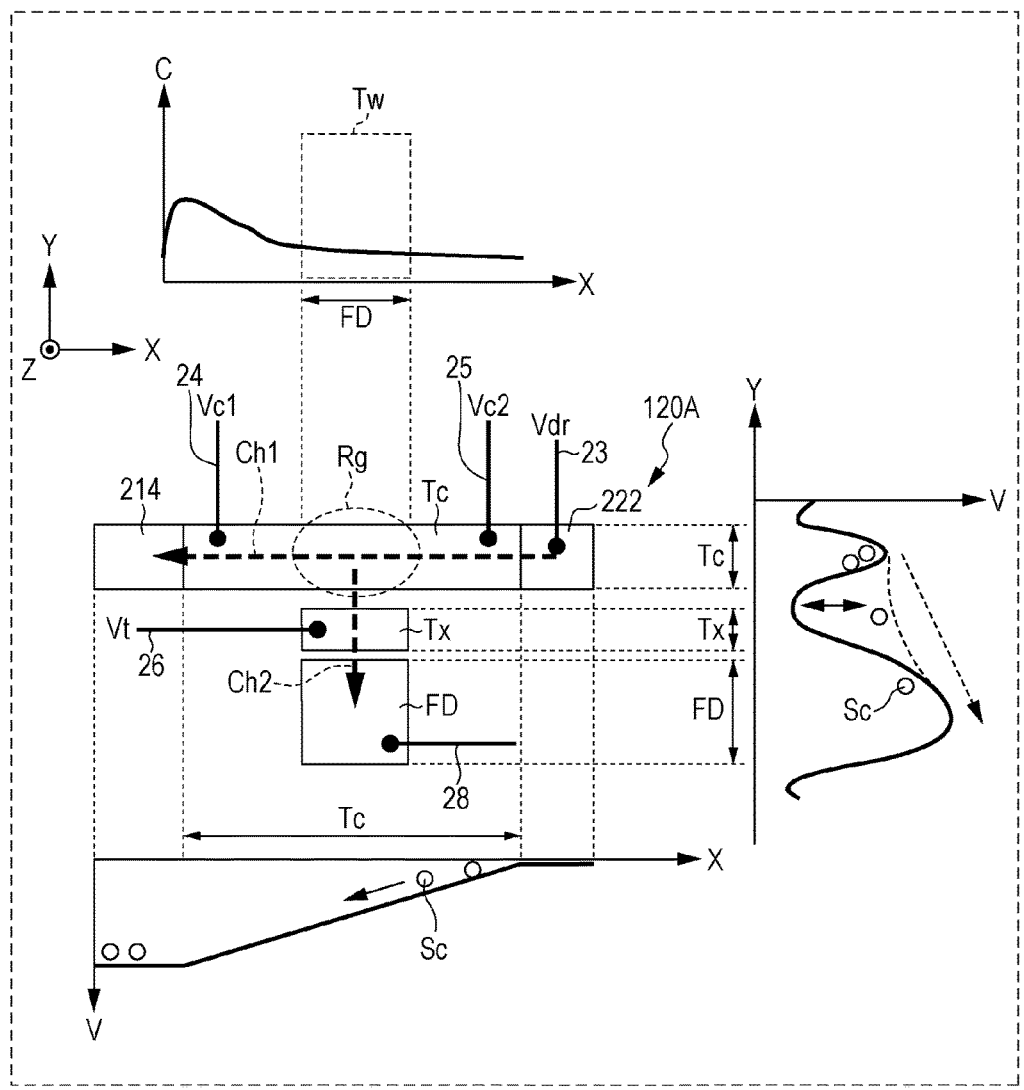
FIG. 6 is a diagram collectively showing a plan view of the charge transfer structure of the photodetector, an example of distribution of signal charges in the first charge transfer channel at a certain time, and an example of the potential in the semiconductor substrate.

FIG. 5 shows an example of a change with time in the intensity I of light incident on the photodetector 100A. In FIG. 5, the horizontal axis represents time t, and the arrow Ex schematically shows the exposure time of the photoelectric conversion structure 110A. FIG. 6 collectively shows a plan view of the charge transfer structure 120A of the photodetector 100A, an example of distribution of signal charges in the first charge transfer channel Ch1 at a certain time, and an example of the potential in the semiconductor substrate 200. The vertical axis of the graph shown on the upper side of FIG. 6 represents charge amount C.

In FIG. 6, the first charge transfer channel Ch1 is indicated by a thick broken line arrow extending along the X-direction, and the second charge transfer channel Ch2 is indicated by a thick broken line arrow extending along the Y-direction. In also other drawings, the first charge transfer channel Ch1 or a second charge transfer channel Ch2 may be indicated by a thick broken line arrow.

On the right side of FIG. 6, an example of the change in the potential along the Y-direction in the semiconductor substrate 200 is shown. The open circles Sc in the graph schematically illustrate electrons as the signal charges. The solid line in the graph shows a change in the potential along the Y-direction in the semiconductor substrate 200 in a state in which the reference voltage Vdr, the first control voltage Vc1, and the second control voltage Vc2 are applied.

On the lower side of FIG. 6, an example of the change in the potential along the X-direction in the semiconductor substrate 200 in a state in which the reference voltage Vdr, the first control voltage Vc1, and the second control voltage Vc2 are applied is shown. Herein, for enabling a more intuitive understanding, an example of applying a first control voltage Vc1 and a second control voltage Vc2 satisfying a relationship of Vdr<Vc2<Vc1 will now be described. As the example described herein, the magnitudes of the first control voltage Vc1 and the second control voltage Vc2 may be different from each other. Voltages capable of forming a channel connecting between the impurity region 222 and the impurity region 214 and transferring signal charges from one of the impurity region 222 and the impurity region 214 to the other can be used as the first control voltage Vc1 and the second control voltage Vc2.

The potential of the impurity region 222 is fixed to 0 V, and as described above, the potential of the impurity region 214 is within a range of 0 to 3.3 V. Focusing on the change in the energy of electrons as signal charges along the X-direction, in this example, the electron energy is the highest in the region near the impurity region 222 and decreases toward the impurity region 214. Accordingly, in a state in which the reference voltage Vdr, the first control voltage Vc1, and the second control voltage Vc2 are applied, electrons as signal charges move in the first charge transfer channel Ch1 from the impurity region 222 toward the impurity region 214. The electrons arrived at the impurity region 214 are discharged from the impurity region 212 to the first voltage line 11 via the channel formed between the impurity region 214 and the impurity region 212 of the photoelectric conversion structure 110A by light irradiation.

Herein, it is assumed that the intensity I of light incident on the photodetector 100A changes with time as shown in FIG. 5. In this case, the dielectric constant of the photoelectric conversion layer 114P in the photoelectric conversion structure 110A also changes corresponding to the change with time in the intensity I of light incident on the photodetector 100A. Accordingly, in the photoelectric conversion structure 110A, the same effect as that caused by a change with time in the effective gate voltage of a field effect transistor occurs, and the current flowing in the channel between the impurity region 214 and the impurity region 212 changes with time in accordance with the change in the intensity I of light incident on the photodetector 100A. In other words, the amount of charges moving in the semiconductor substrate 200 from the impurity region 214 toward the impurity region 212 changes with time according to the change in the intensity I of light.

A change in the amount of charges moving from the impurity region 214 toward the impurity region 212 in the photoelectric conversion structure 110A causes a change in the amount of electrons flowing into the first charge transfer channel Ch1 from the impurity region 222 and transferred to the impurity region 214 according to the potential gradient in the first charge transfer channel Ch1 corresponding to the change with time in the intensity I of the incident light. Accordingly, the amount of signal charges passing a certain point of the first charge transfer channel Ch1 changes with time corresponding to the change with time in the intensity I of the incident light. In other words, the amount of signal charges in the first charge transfer channel Ch1 after an elapse of a certain period of time from the formation of the channel connecting between the impurity region 222 and the impurity region 214 shows a distribution corresponding to the change with time in the intensity I of the incident light, as schematically shown on the upper side of FIG. 6. This is because, in a general perspective, that the movement distance in the first charge transfer channel Ch1 of the signal charges flowed into the first charge transfer channel Ch1 at a certain time is larger than the movement distance in the first charge transfer channel Ch1 of the signal charges flowed into the first charge transfer channel Ch1 at a time later than the certain time.

Accordingly, at a certain time after the start of exposure, the amount of signal charges in the first charge transfer channel Ch1 shows a distribution, for example, as schematically shown by the graph on the upper side of FIG. 6. Herein, it is assumed that a high-level gate control voltage Vt is applied to the transfer gate electrode Tx at a point of time Td. As shown in the graph on the right side of FIG. 6 by a broken line, a high-level gate control voltage Vt reduces the potential barrier between the first charge transfer channel Ch1 and the charge storage FD and makes the gate Gt between the first charge transfer channel Ch1 and the charge storage FD open.

In the opened state of the gate Gt, among the signal charges moving in the first charge transfer channel Ch1, the signal charges moving in and near the region Rg of the first charge transfer channel Ch1 overlapping the transfer gate electrode Tx in the Y-direction are selectively transferred to the charge storage FD via the second charge transfer channel Ch2. It is assumed that the gate control voltage Vt is subsequently changed to a low level, for example, after a time Ts shown in FIG. 5 from a point of time Td to close the gate Gt. The transfer of signal charge to the charge storage FD is stopped by closing the charge gate Gt.

Thus, it is possible to selectively extract a part of the signal charges moving in the first charge transfer channel Ch1 into the charge storage FD by disposing the charge storage FD in the middle of the first charge transfer channel Ch1 and controlling the open and close of the gate Gt between the first charge transfer channel Ch1 and the charge storage FD. As schematically shown in FIGS. 1 to 6, among the signal charges in the first charge transfer channel Ch1, the amount of charges to be transferred to the charge storage FD depends on the distance Ld from the end of the impurity region 222 to the charge storage FD along the X-direction and the width Lw of the charge storage FD. The amount of charges transferred to and stored in the charge storage FD corresponds to the amount of charges flowed into the first charge transfer channel Ch1 from the impurity region 222 in a period of time from a point of time Td to a point of time (Td+Ts). That is, the amount of charges transferred to and stored in the charge storage FD involves information on the amount of light incident on the photoelectric conversion layer 114P during the period of time Ts in the entire exposure time of the photoelectric conversion structure 110A indicated by the arrow Ex in FIG. 5. Accordingly, detection in a time window Tw corresponding to the time Ts starting from the time Td is achieved by reading out the charges stored in the charge storage FD. Thus, the photodetector 100A can perform photodetection in a desired time window.

Existing image pickup devices including photodiodes employ, for example, a system that transfers all the charges generated by a photodiode to floating diffusion and reads out the transferred charges. In contrast, in the above-described exemplary operation of the photodetector 100A, a part of the signal charges moving in the first charge transfer channel Ch1 from the impurity region 222 toward the impurity region 214 is extracted and is stored in the charge storage FD. Accordingly, the photodetector 100A can achieve faster detection compared to the existing system that transfers all the signal charges generated by a photodiode to floating diffusion. In an embodiment of the present disclosure, the time for resetting a photodiode, which has been necessary in the existing system, is substantially zero, and the time for storing signal charges is not the whole exposure time and is merely a part thereof. Accordingly, faster operation can be achieved.

In an embodiment of the present disclosure, for example, the open and close of the gate Gt is electrically controlled by means of the gate control voltage Vt. It is possible to extract a part of the signal charges moving in the first charge transfer channel Ch1 toward the impurity region 214 at an appropriate starting time for an appropriate period of time and to store the extracted signal charges in the charge storage FD by controlling the timing of the open and close of the gate Gt. That is, a part of the signal charges can be easily sampled in a desired time window. The time window for detection can also be controlled by, for example, the distance Ld from the impurity region 222 to the charge storage FD or the transfer gate electrode Tx in the direction along the first charge transfer channel Ch1, the length Lw of the charge storage FD or the transfer gate electrode Tx in the direction along the first charge transfer channel Ch1 shown in FIG. 1 and the time length of the gate Gt open.

Figure 7:
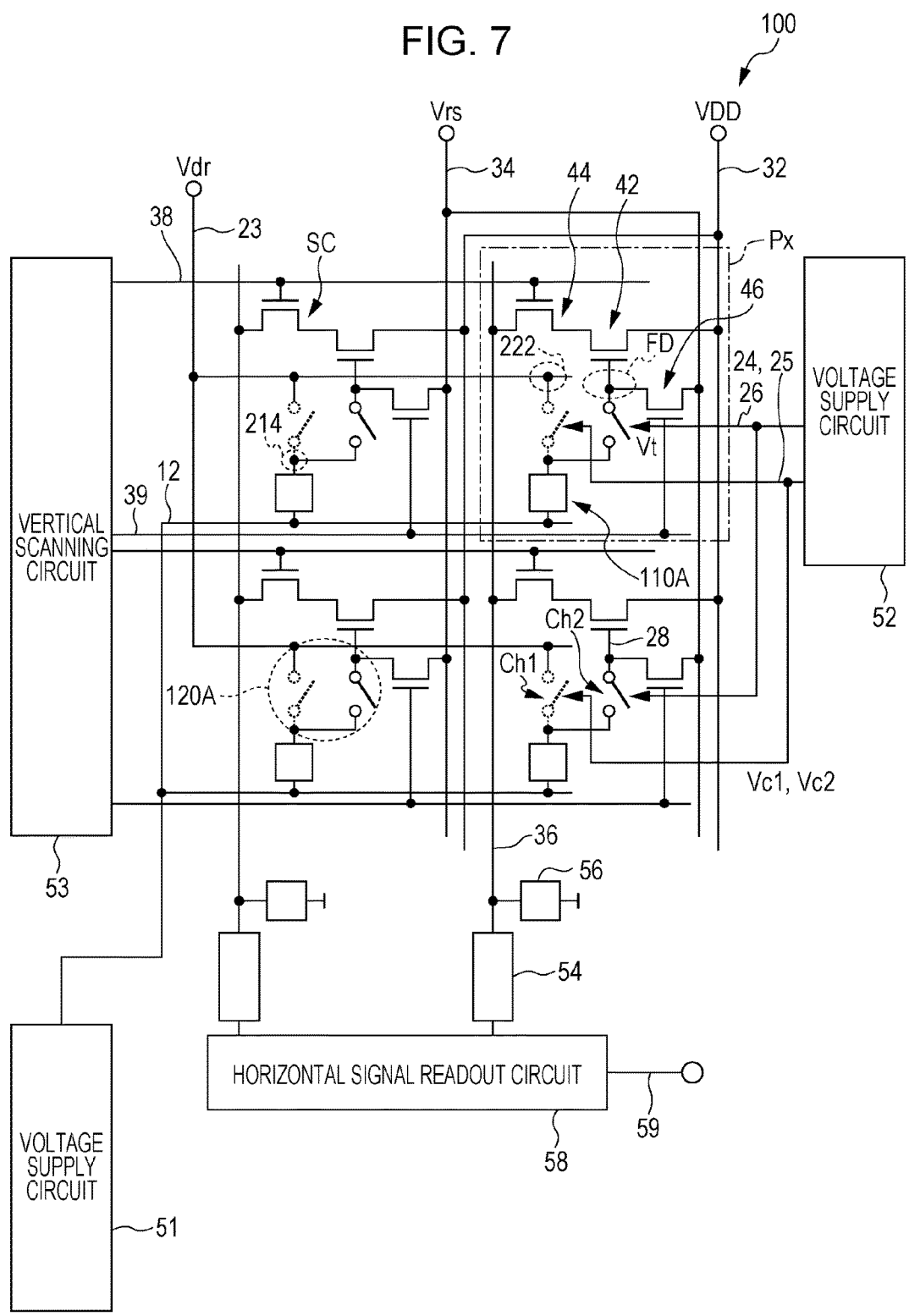
FIG. 7 is a diagram schematically illustrating an example of the circuit structure of an image pickup device including a plurality of pairs of a photoelectric conversion structure and a charge transfer structure.

In the above-described example of operation, voltages different from each other are applied to both ends of the control electrode Tc. However, the use of different voltages as the first control voltage Vc1 and the second control voltage Vc2 is not essential for the operation. In the case of using electrons as the signal charges, the electrons can move from the impurity region 222 toward the impurity region 214 if the potential of the impurity region 214 is higher than that of the impurity region 222. Accordingly, a common voltage may be applied to both ends of the control electrode Tc. However, independent application of voltages different from each other to both ends of the control electrode Tc can control the magnitude of the potential gradient between the impurity region 222 and the impurity region 214 in the first charge transfer channel Ch1 via the insulating layer 124S below the control electrode Tc. Accordingly, the transfer speed of signal charges from the impurity region 222 to the impurity region 214 can be electrically controlled. For example, it is also possible to adjust the starting point of the time window afterwards by adjusting the potential gradient between the impurity region 222 and the impurity region 214. Furthermore, for example, in the case of repeating the detection operation, the potential gradient in the first charge transfer channel Ch1 may be changed at each time of resetting the charges stored in the charge storage FD such that signal charges are extracted into the charge storage FD at different transfer speeds. The first control voltage Vc1 and the second control voltage Vc2 applied to the control electrode Tc may be digital signals such as high-level and low-level voltages or may be analog signals of appropriate magnitudes. Example of application to image pickup device FIG. 7 schematically illustrates an exemplary circuit structure for explaining an application example of a photodetector 100A to an image pickup device. The image pickup device 100 illustrated in FIG. 7 includes a plurality of pairs of the photoelectric conversion structure 110A and the charge transfer structure 120A described above. In FIG. 7, in order to avoid excessive complication of the drawing, the photoelectric conversion structure 110A is schematically shown as an open rectangle.

The image pickup device 100 illustrated in FIG. 7 includes a plurality of pixels Px each including a photoelectric conversion structure 110A and a charge transfer structure 120A. Two adjacent pixels Px can be electrically isolated from each other by an element isolation region formed in the semiconductor substrate 200. The distance between the centers of two adjacent pixels Px can be, for example, about 2 µm. These pixels Px are, for example, two-dimensionally arranged to form an image pickup area. Herein, the image pickup device 100 includes four pixels Px arranged in a matrix of two rows and two columns. The number and arrangement of pixels Px are not limited to the exemplary structure illustrated in FIG. 7 and may be appropriately set.

In the structure illustrated in FIG. 7, the image pickup device 100 includes peripheral circuits: a vertical scanning circuit 53, a column signal processing circuit 54, a load circuit 56, and a horizontal signal readout circuit 58. The image pickup device 100 further includes a voltage supply circuit 51 connected to the photoelectric conversion structure 110A of each pixel Px and a voltage supply circuit 52 connected to the charge transfer structure 120A of each pixel Px.

As schematically illustrated in FIG. 7, the voltage supply circuit 51 is connected to a second voltage line 12 connected to the transparent gate electrode 112 of the photoelectric conversion structure 110A of each pixel Px. Although the illustration is omitted for avoiding complication of the drawing, the voltage supply circuit 51 can be connected to a first voltage line 11 connected to the impurity region 212 of the photoelectric conversion structure 110A of each pixel Px.

During operation of the image pickup device 100, the voltage supply circuit 51 supplies a second bias voltage Vb2 to the transparent gate electrode 112 of each pixel Px. The second bias voltage Vb2 is a voltage that falls within a predetermined range when the potential of the impurity region 212 is regarded as a standard. For example, the voltage supply circuit 51 applies a first bias voltage Vb1 of 3.3 V to the impurity region 212 of each pixel Px via the first voltage line 11 and applies a second bias voltage Vb2 of approximately 3.3 V to the transparent gate electrode 112 of each pixel Px via the second voltage line 12. As described later, the range of the voltage to be supplied as the second bias voltage Vb2 to the transparent gate electrode 112 by the voltage supply circuit 51 can be determined based on the current-voltage characteristics of the photoelectric conversion layer 114P.

In this example, a fourth voltage line 24 and a fifth voltage line 25 connected to the control electrode Tc of the charge transfer structure 120A are connected to the voltage supply circuit 52. The voltage supply circuit 52 supplies a first control voltage Vc1 to the control electrode Tc via the fourth voltage line 24 and supplies a second control voltage Vc2 to the control electrode Tc via the fifth voltage line 25. As described with reference to FIG. 6, the potential gradient in the first charge transfer channel Ch1 can be controlled by the first control voltage Vc1 and the second control voltage Vc2 supplied to control electrode Tc. In this example, the voltage supply circuit 52 is also connected to the gate control line 26. That is, in this example, the voltage supply circuit 52 also has a function of supplying a gate control voltage Vt, which is used for control of start and stop of transfer of signal charges from the first charge transfer channel Ch1 to the charge storage FD via the second charge transfer channel Ch2, to the transfer gate electrode Tx.

The structure of the voltage supply circuit 52 is not limited to a specific circuit structure and may be any structure that can supply a predetermined voltage at a predetermined timing. Similarly, the structure of the voltage supply circuit 51 is also not limited to a specific circuit structure. The voltage supply circuit 51 and the voltage supply circuit 52 are not limited to specific power source circuits and may be each a circuit generating a predetermined voltage or a circuit converting a voltage supplied from another power source into a predetermined voltage. The voltage supply circuit 51 and the voltage supply circuit 52 may be provided as different independent circuits, for example, on the semiconductor substrate 200 or may each be a part of a single power source circuit. Alternatively, a part or the whole of the voltage supply circuit 51 and the voltage supply circuit 52 may be a part of the vertical scanning circuit 53. At least one of the first bias voltage Vb1, the second bias voltage Vb2, the first control voltage Vc1, the second control voltage Vc2, and the gate control voltage Vt may be supplied to each pixel Px from the vertical scanning circuit 53.

In the structure illustrated in FIG. 7, each pixel Px further includes a signal detection circuit SC including a signal detection transistor 42, an address transistor 44, and a reset transistor 46. The signal detection transistor 42, the address transistor 44, and the reset transistor 46 are typically field effect transistors formed in the semiconductor substrate 200. A structure in which the signal detection transistor 42, the address transistor 44, and the reset transistor 46 are N-channel MOS transistors will now be exemplified.

As illustrated, the gate of the signal detection transistor 42 is connected to a reading line 28 connected to the charge storage FD. The drain of the signal detection transistor 42 is connected to a power source line 32 supplying a power source voltage VDD to each pixel Px, and the source is connected to a vertical signal line 36 via the address transistor 44. The vertical signal line 36 is provided to each column of the pixels Px and is connected to a column signal processing circuit 54 and a load circuit 56. The load circuit 56 and the signal detection transistor 42 form a source follower circuit and can read out a signal corresponding to the amount of charges stored in the charge storage FD to the vertical signal line 36. The column signal processing circuit 54 performs, for example, noise suppression signal processing represented by correlated double sampling and analog-digital conversion. The column signal processing circuit 54 is electrically connected to the horizontal signal readout circuit 58. The horizontal signal readout circuit 58 sequentially reads out a signal from the column signal processing circuit 54 to a horizontal common signal line 59.

The address signal line 38 connected to the gate of the address transistor 44 is connected to the vertical scanning circuit 53. A row selection signal for controlling on and off of the address transistor 44 is sent out for each address signal line 38 to scan and select the row to be read by the vertical scanning circuit 53. A signal voltage is read out from each pixel Px in the selected row to the vertical signal line 36.

As illustrated, in this example, the charge storage FD is connected to a reset transistor 46. The reset transistor 46 is connected to a reset voltage line 34 supplying a predetermined reset voltage Vrs and resets the potential of the charge storage FD by being switched on. In this example, a reset signal line 39 connected to the gate of the reset transistor 46 is connected to the vertical scanning circuit 53. The vertical scanning circuit 53 supplies a reset signal to the pixels Px via the reset signal line 39 to select pixels Px on a row unit basis and reset the potential of the charge storage FD of each pixel Px.

The photodetector 100A can be produced through a general semiconductor manufacturing process. In particular, in the case of using a silicon substrate as the semiconductor substrate 200, the photodetector 100A can be produced by using various silicon semiconductor processes. The photoelectric conversion structure of a photodetector of the present disclosure has a device structure similar to that of a field effect transistor. Accordingly, the photodetector of the present disclosure and another transistor can be relatively easily formed on a single semiconductor substrate.

Second Embodiment

Figure 8:
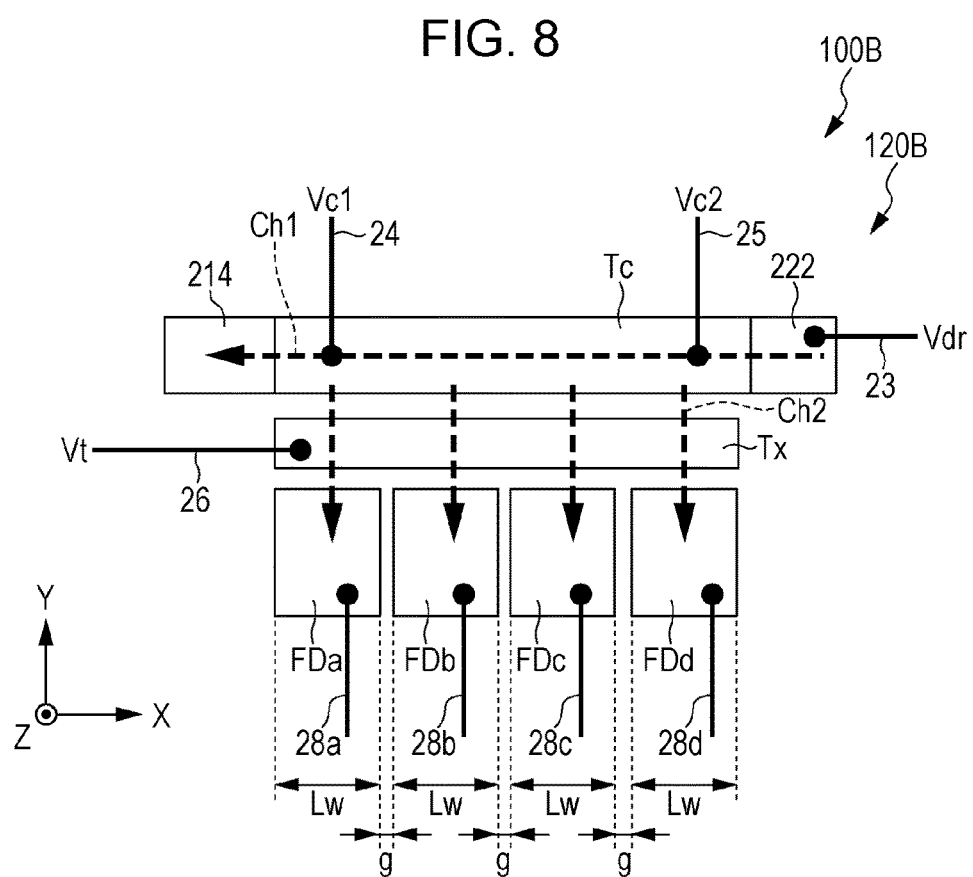
FIG. 8 is a plan view schematically illustrating the charge transfer structure taken out from a photodetector according to a second embodiment of the present disclosure.

FIG. 8 schematically illustrates an example of the charge transfer structure of a photodetector according to a second embodiment of the present disclosure. The photodetector 100B illustrated in FIG. 8 is similar to the photodetector 100A shown in FIGS. 1 to 3 in that it includes a photoelectric conversion structure and a charge transfer structure. However, the photodetector 100B includes a charge transfer structure 120B instead of the charge transfer structure 120A described above. In FIG. 8, the illustration of the photoelectric conversion structure 110A of the photodetector 100B is omitted. A main difference between the charge transfer structure 120B shown in FIG. 8 and the charge transfer structure 120A described with reference to FIG. 6, etc. is that the charge transfer structure 120B includes a plurality of charge storages arranged along the first charge transfer channel Ch1.

In the structure illustrated in FIG. 8, four charge storages FDa to FDd having a length in the X-direction of Lw are arranged with an interval of g along the X-direction. The number of the charge storages, the length of each charge storage in the direction along the first charge transfer channel Ch1, and the interval of adjacent two charge storages are merely examples. For example, the number of the charge storages included in the charge transfer structure 120B is not limited to four. The widths of a plurality of charge storages may be different from one another, and the intervals may be different from one another.

In the structure illustrated in FIG. 8, a single transfer gate electrode Tx is disposed between the first charge transfer channel Ch1 and the charge storages FDa to FDd. In this example, the transfer gate electrode Tx extends along the X-direction from the left end of the charge storage FDa to the right end of the charge storage FDd. That is, herein, the length of the transfer gate electrode Tx in the X-direction is (4Lw+3g).

As described later, a high-level potential of the transfer gate electrode Tx can make the gate between the first charge transfer channel Ch1 and each of the charge storages FDa to FDd open. The signal charges moving in the first charge transfer channel Ch1 can be transferred and distributed into the charge storages FDa to FDd by making the gate between the first charge transfer channel Ch1 and each of the charge storages FDa to FDd open. That is, the charge transfer structure 120B includes four second charge transfer channels Ch2 that transfer charges from the first charge transfer channel Ch1 to the four charge storages FDa to FDd, respectively.

The charge storages FDa to FDd are respectively connected to reading lines 28a to 28d. The reading lines 28a to 28d can be connected to corresponding signal detection circuits. That is, the signal charges stored in the charge storages FDa to FDd can be each independently read out.

Operation of Photodetector 100B

Figure 9:
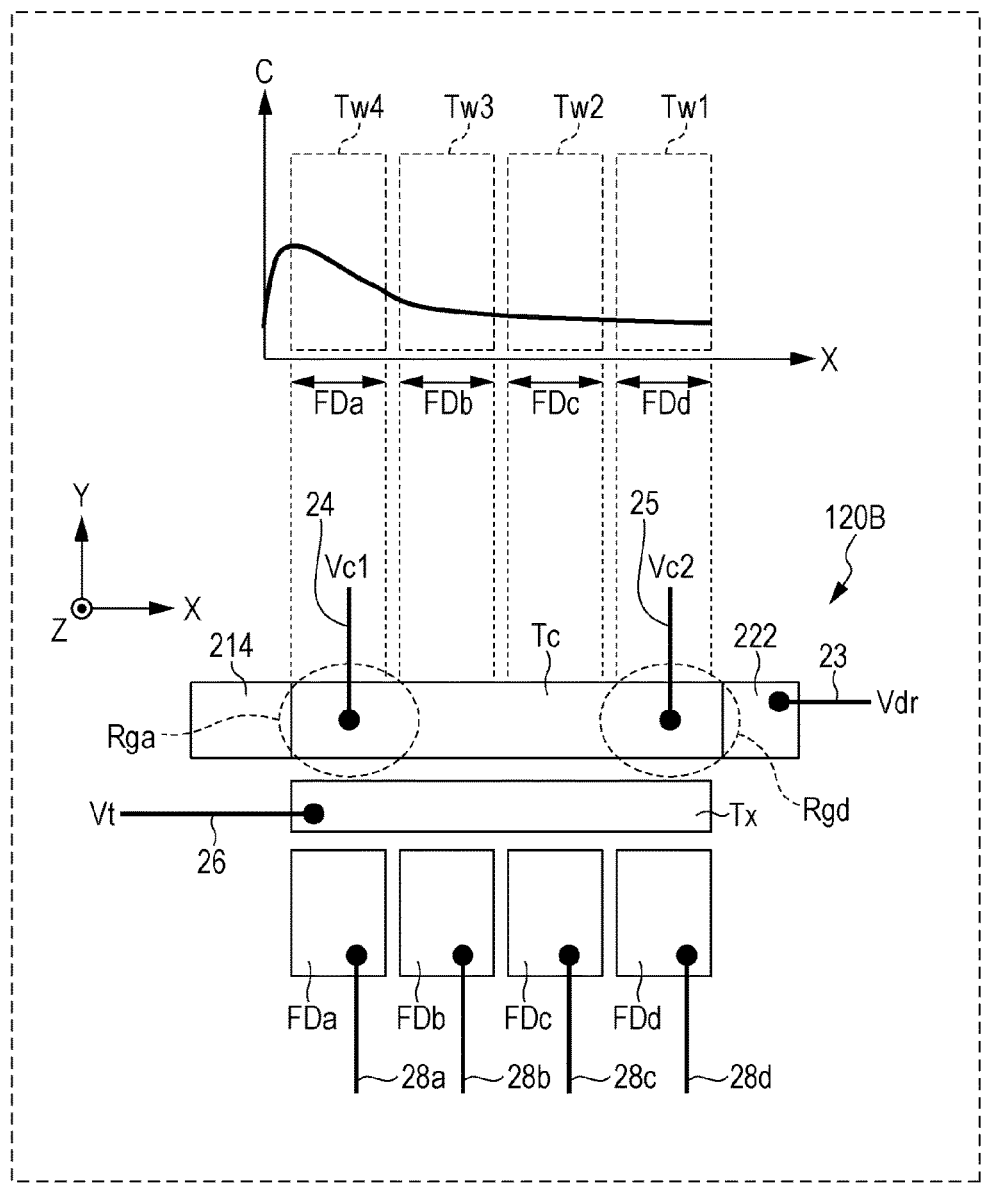
FIG. 9 is a diagram collectively showing a plan view of the charge transfer structure and an example of distribution of signal charges in the first charge transfer channel at a certain time.

Subsequently, an example of signal detection operation using the charge transfer structure 120B will now be described with reference to FIG. 9. FIG. 9 collectively shows a plan view of the charge transfer structure 120B and an example of distribution of signal charges in the first charge transfer channel Ch1 at a certain time.

Prior to detection of light, the charge storages FDa to FDd are each reset. For example, the reset transistor 46 in each of the signal detection circuits connected to the respective reading lines 28a to 28d is switched on, and the reset transistor 46 is then switched off. At this point of time, the first control voltage Vc1, the second control voltage Vc2, and the gate control voltage Vt are all at low levels. Since the first control voltage Vc1 and the second control voltage Vc2 are at low levels, no inversion layer is formed under the control electrode Tc.

Subsequently, the first control voltage Vc1 and the second control voltage Vc2 are changed to high levels. Herein, as in description with reference to FIG. 6, a first control voltage Vc1 and a second control voltage Vc2 satisfying a relationship of Vdr<Vc2<Vc1 are applied to the fourth voltage line 24 and the fifth voltage line 25, respectively. As a result, as in the example described with reference to FIG. 6, a potential gradient similar to that shown on the lower side of FIG. 6 is formed in the first charge transfer channel Ch1.

In this state, light incidence on the photoelectric conversion structure 110A causes occurrence of a current corresponding to a change in the dielectric constant of the photoelectric conversion layer 114P between the impurity region 212 and the impurity region 214 of the photoelectric conversion structure 110A, as in the example described with reference to FIG. 6. This change in current causes a change in the potential of the impurity region 214 within a range between the potential of the impurity region 212 and the potential of the impurity region 222. Herein, a first bias voltage Vb1 of 3.3 V is applied to the impurity region 212, and a reference voltage Vdr of 0 V is applied to the impurity region 222. Accordingly, the potential of the impurity region 214 changes within a range of 0 to 3.3 V depending on the illuminance. The potential of the impurity region 214 increases up to near 3.3 V with an increase in illuminance.

Irradiation of the photoelectric conversion structure 110A with light causes a change in the dielectric constant of the photoelectric conversion layer 114P and thereby a change in the potential of the impurity region 214. Consequently, a flow of electrons from the impurity region 222 at a low potential to the impurity region 214 at a high potential occurs in the first charge transfer channel Ch1. On this occasion, the transfer speed of electrons to the impurity region 214 can be adjusted by controlling the magnitude of the potential gradient through regulation of the first control voltage Vc1 and the second control voltage Vc2.

Herein, it is assumed that light changing with time as shown in FIG. 5 enters the photoelectric conversion structure 110A. As already described with reference to FIGS. 5 and 6, if the intensity of light incident on the photoelectric conversion structure 110A changes with time, the amount of electrons as signal charges passing a certain point of the first charge transfer channel Ch1 changes with time depending on the change with time in the intensity of the incident light. Accordingly, the amount of signal charges in the first charge transfer channel Ch1 at a certain time from the start of light incidence on the photoelectric conversion structure 110A distributes depending on the change with time in the intensity I of the incident light as schematically shown on the upper side of FIG. 9.

For example, it is assumed that the gate control voltage Vt applied to the transfer gate electrode Tx is changed to a high level at a point of time Td. A high-level gate control voltage Vt decreases the potential barrier between the first charge transfer channel Ch1 and each of the charge storages FDa to FDd to make the gate between the first charge transfer channel Ch1 and each of the charge storages FDa to FDd open.

The opening of the gate transfers signal charges moving in the first charge transfer channel Ch1 to the charge storages FDa to FDd via the second charge transfer channel Ch2. On this occasion, the signal charges moving in the first charge transfer channel Ch1 are transferred to any of the charge storages FDa to FDd. Among the charge storages FDa to FDd, the charge storage to which a signal charge is transferred depends on the movement distance of the signal charge at a point of time Td. For example, at a point of time Td, signal charges present in or near the region Rga overlapping the charge storage FDa in the Y-direction are transferred to the charge storage FDa, and signal charges present in or near the region Rgd overlapping the charge storage FDd in the Y-direction are transferred to the charge storage FDd. Thus, arrangement of a plurality of charge storages FDa to FDd along the first charge transfer channel Ch1 allows signal charges moving in the first charge transfer channel Ch1 to be distributed to the charge storages FDa to FDd according to the movement distances at the time when the gate is opened.

As schematically shown on the upper side of FIG. 9, the amount of signal charges in the first charge transfer channel Ch1 at a certain time has a distribution. Accordingly, the amount of charges stored in the charge storages FDa to FDd shows a distribution corresponding to the distribution of the signal charges in the first charge transfer channel Ch1 at the point of time. This means that signal charges generated by light incidence are time-resolved and detected in time windows Tw1 to Tw4 indicated by broken lines in the graph on the upper side of FIG. 9.

For example, it takes 100 ps for electrons to move through a charge transfer channel having a length of 4 µm and applied with an electric field intensity giving a saturation velocity of 0.04 µm/ps, to the charge storage. Accordingly, in a structure directly transferring electrons as signal charges to a charge storage via a charge transfer channel having a length of 4 µm, it takes 100 ps to merely transfer signal charges. In contrast, as shown in FIGS. 8 and 9, in a structure including a plurality of charge storages arranged along a charge transfer channel and distributing electrons moving in the charge transfer channel to the charge storages, the time resolution can be improved. For example, a time resolution of about 25 ps can be achieved even under the same electric field intensity as above by arranging four charge storages along a charge transfer channel having a length of 4 µm.

Thus, in the second embodiment of the present disclosure, the time resolution in detection can be improved by distributing signal charges moving in the first charge transfer channel Ch1 to a plurality of charge storages according to the movement distance of the signal charges, without being restricted by the saturation velocity. If a structure distributing signal charges to a plurality of charge storages according to the movement distance in the first charge transfer channel Ch1 such as the example described above is applied to, for example, imaging using near-infrared light, information on a measurement target in the depth direction can be obtained. On this occasion, the SN ratio can be improved by repeating a cycle of light pulse irradiation and transfer and storage of signal charges described with reference to FIG. 9 and integrating the amounts of charges in individual charge storages. The gate provided to the second charge transfer channel Ch2 for transferring charges to a charge storage may be opened at a predetermined timing for each light pulse irradiation.

The time window in detection also can be controlled by adjusting the length of each charge storage in the direction along the first charge transfer channel Ch1 and the interval between two adjacent charge storages. For example, the lengths of the individual charge storages in the direction along the first charge transfer channel Ch1 may be adjusted to a ratio corresponding to the ratio of desired time resolution.

In the example shown in FIGS. 8 and 9, a single transfer gate electrode Tx common to a plurality of charge storages FDa to FDd is disposed. However, a plurality of gate electrodes corresponding to the charge storages FDa to FDd, respectively, may be disposed on the semiconductor substrate 200, as described below.

Figure 10:
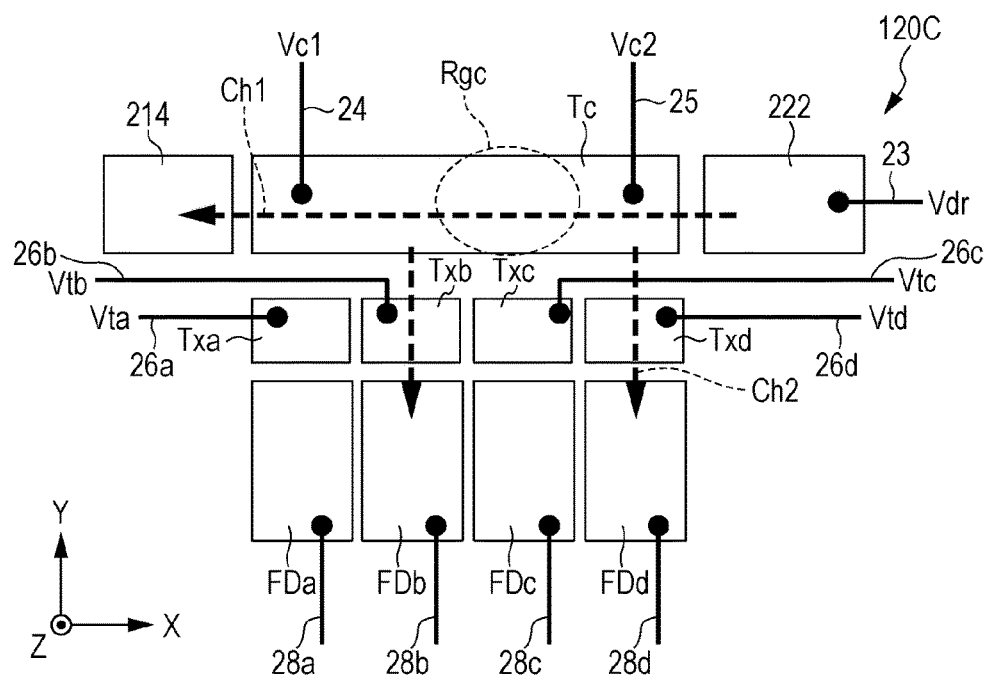
FIG. 10 is a plan view schematically illustrating a modification example of the charge transfer structure.

FIG. 10 schematically illustrates a modification example of the charge transfer structure. The charge transfer structure 120C illustrated in FIG. 10 includes transfer gate electrodes Txa to Txd are arranged between the first charge transfer channel Ch1 and the charge storages FDa to FDd so as to correspond to the charge storages FDa to FDd, respectively. As illustrated, the transfer gate electrodes Txa to Txd are connected to gate control lines 26a to 26d, respectively. Accordingly, the transfer gate electrodes Txa to Txd can each independently apply gate control voltages Vta to Vtd, respectively. That is, the charge transfer structure 120C includes four gates, which is the same number as that of the charge storages arranged along the first charge transfer channel Ch1. These gates are disposed so as to correspond to the four second charge transfer channels Ch2.

In a structure as illustrated in FIG. 10, for example, two gates between the first charge transfer channel Ch1 and the charge storage FDb and between the first charge transfer channel Ch1 and the charge storage FDd can be selectively opened, as illustrated, by selectively applying high-level gate control voltages Vtb and Vtd at a certain time. For example, signal charges in or near the region Rgc overlapping the charge storage FDc in the Y-direction, among signal charges moving in the first charge transfer channel Ch1, can be transferred toward the charge storage FDb by selectively opening a part of a plurality of gates disposed along the first charge transfer channel Ch1. In such a control, signal charges can be satisfactorily separated into two charge storages with gates in an open state, that is, between the charge storage FDb and the charge storage FDd in this example.

In a structure including a plurality of transfer gate electrodes arranged so as to correspond to a plurality of charge storages in a pixel, the charge storage FDd, which is closest to the impurity region 222 as a resource of electrons serving as signal charges, can also be used as a drain. For example, in the structure illustrated in FIG. 10, the gate control voltage Vtd is changed to a high level after a certain point of time to open the gate between the first charge transfer channel Ch1 and the charge storage FDd, and signal charges flowed into the first charge transfer channel Ch1 after the certain point of time are preferentially transferred to the charge storage FDd. Accordingly, it is possible to suppress excess charges from mixing into the charge storages FDa to FDc by maintaining the high-level gate control voltage Vtd after the time at which the gate control voltages Vta to Vtc are changed to high levels to open the gates between the first charge transfer channel Ch1 and the charge storages FDa to FDc.

Thus, the transfer gate electrodes may be arranged in a pixel so as to correspond to a plurality of charge storages, and a high-level gate control voltage may be applied to a plurality of transfer gate electrodes at different timing. Such a structure can independently control the transfer of charges to the charge storages. In addition, detection operation similar to that in the structure including a single gate electrode common to a plurality of charge storages is possible by simultaneously applying a high-level voltage to the transfer gate electrodes.

Third Embodiment

Figure 11:
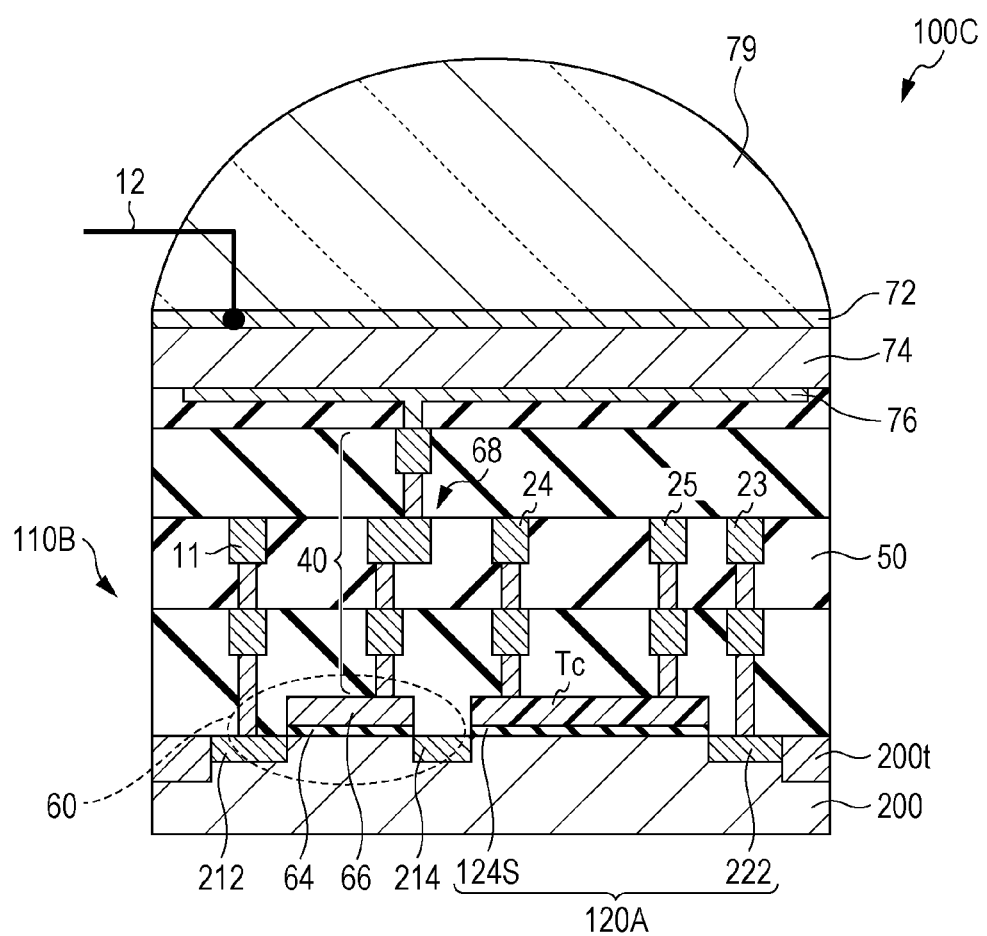
FIG. 11 is a cross-sectional view schematically illustrating a photodetector according to a third embodiment of the present disclosure.

FIG. 11 schematically illustrates a cross-section of a photodetector according to a third embodiment of the present disclosure. The photodetector 100C illustrated in FIG. 11 is similar to the photodetector 100A shown in FIGS. 1 to 3 in that it includes a photoelectric conversion structure and a charge transfer structure. However, the photodetector 100C includes a photoelectric conversion structure 110B instead of the photoelectric conversion structure 110A.

The photoelectric conversion structure 110B illustrated in FIG. 11 includes a field effect transistor 60 including an impurity region 212 and an impurity region 214 formed in a semiconductor substrate 200. Herein, the impurity region 212 functions as a drain region of the field effect transistor 60, and the impurity region 214 functions as a source region of the field effect transistor 60. As schematically illustrated in FIG. 11, the field effect transistor 60 includes a gate insulating layer 64 located on the semiconductor substrate 200 in a region between the impurity region 212 and the impurity region 214 and a gate electrode 66 on the gate insulating layer 64. The gate insulating layer 64 is, for example, a silicon thermal oxide film. The gate insulating layer 64 in the field effect transistor 60 can have the same layer structure as that of the insulating layer 124S in the charge transfer structure 120A. The gate electrode 66 in the field effect transistor 60 can have the same layer structure as that of the control electrode Tc in the charge transfer structure 120A.

The photoelectric conversion structure 110B includes a junction 68 and a layered structure composed of an upper electrode 72, a photoelectric conversion layer 74, and a lower electrode 76, in addition to the field effect transistor 60. The layered structure composed of the upper electrode 72, the photoelectric conversion layer 74, and the lower electrode 76 is located above the semiconductor substrate 200. The photoelectric conversion layer 74 is disposed between the upper electrode 72 and the lower electrode 76.

In the structure illustrated in FIG. 11, the layered structure composed of the upper electrode 72, the photoelectric conversion layer 74, and the lower electrode 76 is supported by an interlayer insulating layer 50 formed so as cover the semiconductor substrate 200. The junction 68 is disposed in the interlayer insulating layer 50 and electrically connects between the lower electrode 76 and the gate electrode 66 of the field effect transistor 60.

The interlayer insulating layer 50 may include a layered structure including a plurality of insulating layers of, for example, silicon oxide films. In this example, multilayer wiring 40 is disposed in the interlayer insulating layer 50. Herein, the multilayer wiring 40 includes three wiring layers, and the central wiring layer includes a first voltage line 11, a third voltage line 23, a fourth voltage line 24, and a fifth voltage line 25. However, it is not necessary that all of these lines are disposed in the layer. The number of the insulating layers in the interlayer insulating layer 50 and the number of the wiring layers in the multilayer wiring 40 are not limited to those shown in FIG. 11.

The structure on the interlayer insulating layer 50 is focused on. Herein, the upper electrode 72 is a transparent electrode, and light passed through the upper electrode 72 enters the photoelectric conversion layer 74. The upper electrode 72 may be made of, for example, TCO as in the transparent gate electrode 112 in the photoelectric conversion structure 110A. In the example shown in FIG. 11, a microlens 79 is disposed on the upper electrode 72 on the side opposite to the photoelectric conversion layer 74. Furthermore, for example, an optical filter, such as an infrared transmission filter, and a protective layer of the photoelectric conversion layer 74 can be disposed between the upper electrode 72 and the microlens 79.

As schematically illustrated in FIG. 11, the upper electrode 72 is connected to a second voltage line 12 as the transparent gate electrode 112 in the photoelectric conversion structure 110A. During operation of the photodetector 100C, the first voltage line 11 supplies a predetermined first bias voltage Vb1 to the impurity region 212, and the second voltage line 12 supplies a second bias voltage Vb2 that falls within a predetermined range when the potential of the impurity region 212 is regarded as a standard, to the upper electrode 72.

The photoelectric conversion layer 74 can have substantially the same structure as that of the photoelectric conversion layer 114P in the photoelectric conversion structure 110A described above. The photoelectric conversion layer 74 has a thickness of, for example, about 200 nm. The details of, for example, the material constituting the photoelectric conversion layer 74 are described later.

The lower electrode 76 is typically a metal electrode or a metal nitride electrode. Examples of the material forming the lower electrode 76 include Al, Cu, Ti, TiN, Ta, TaN, Mo, Ru, and Pt. The lower electrode 76 may be formed of, for example, polysilicon provided with conductivity by impurity doping. Herein, a TiN electrode is used as the lower electrode 76. Formation of a light shielding electrode as the lower electrode 76, for example, suppresses stray light from entering the channel region of the field effect transistor 60 and contributes to a reduction in noise.

The junction 68 connected to the lower electrode 76 includes a part of the multilayer wiring 40 and has a function of electrically connecting the lower electrode 76 to the gate electrode 66 of the field effect transistor 60. The multilayer wiring 40 is formed of, for example, a metal such as copper. A wiring layer in the multilayer wiring 40 may be a light shielding film.

The photoelectric conversion structure 110B illustrated in FIG. 11 can have a structure including a conductive structure including a lower electrode 76, a junction 68, and a gate electrode 66 between the photoelectric conversion layer 114P in the photoelectric conversion structure 110A and the insulating layer 114S, compared to the photoelectric conversion structure 110A described with reference to FIGS. 1 to 3. Alternatively, it is possible to recognize the photoelectric conversion structure 110B itself as a single field effect transistor. From such a viewpoint, the photoelectric conversion structure 110B is recognized as a field effect transistor including a gate composed of series connection of a capacitor including the gate insulating layer 64 as a dielectric layer and a capacitor including the photoelectric conversion layer 74 as a dielectric layer. Herein, the layered structure including a conductive structure composed of the lower electrode 76, the junction 68, and the gate electrode 66 between the gate insulating layer 64 and the layered structure of the photoelectric conversion layer 74 constitutes the gate capacity in the field effect transistor, and the upper electrode 72 constitutes the gate electrode.

The principle of light detection by the photodetector 100C is substantially the same as that in the first embodiment. In a state in which a bias voltage within a predetermined range is applied between both main surface of the photoelectric conversion layer 74 by applying predetermined first bias voltage Vb1 and second bias voltage Vb2 to the impurity region 212 and the upper electrode 72, respectively, light enters the photoelectric conversion layer 74 via the upper electrode 72. The light incidence on the photoelectric conversion layer 74 causes generation of a pair of positive and negative charges in the photoelectric conversion layer 74 to change the dielectric constant of the photoelectric conversion layer 74. In other words, the dielectric constant between the upper electrode 72 and the lower electrode 76 changes. On this occasion, basically, no charge exchange occurs between the photoelectric conversion layer 74 and the upper electrode 72 and between the lower electrode 76 and the photoelectric conversion layer 74.

If the photoelectric conversion structure 110B is recognized as a single field effect transistor, a change in the dielectric constant of the photoelectric conversion layer 74 causes the same effect as that caused by a change in the gate capacity of this transistor. A change in the dielectric constant of the photoelectric conversion layer 74 causes a change in the effective gate voltage of the field effect transistor 60, and a current corresponding to the change in the dielectric constant of the photoelectric conversion layer 74 occurs between the impurity region 212 and the impurity region 214. In other words, the drain current in the field effect transistor 60 changes. In first charge transfer channel Ch1 of the charge transfer structure 120A, the change in the drain current causes a current of electrons from the impurity region 222 toward the impurity region 214 corresponding to the change in the current occurring between the impurity region 212 and the impurity region 214. The charge transfer structure 120A transfers at least a part of the electrons moving from the impurity region 222 toward the impurity region 214 to the charge storage FD at a desired timing via the second charge transfer channel Ch2. Photodetection in a desired time window is achieved by reading out the charges transferred to the charge storage FD by an appropriate signal detection circuit.

According to the third embodiment, a photoelectric conversion layer 74 is disposed on an interlayer insulating layer 50 covering a semiconductor substrate 200 by electrically connecting a lower electrode 76 located on the semiconductor substrate 200 side of the photoelectric conversion layer 74 to a gate electrode 66 of a field effect transistor 60 on the semiconductor substrate 200 through a junction 68. In such a structure, a region where the upper electrode 72 and the lower electrode 76 overlap when viewed from the normal direction of the semiconductor substrate 200 corresponds to a light receiving section. Accordingly, a higher aperture ratio can be readily obtained compared to the structure having the photoelectric conversion layer on the side of the charge transfer channel. In addition, the degree of freedom of wiring layout in the multilayer wiring 40 is increased.

As in the example described with reference to FIG. 7, a plurality of photodetectors 100C are, for example, two-dimensionally arranged, and this set of the photodetectors can be used as an image pickup device. In such a case, each of the photodetectors 100C as pixels Px is electrically isolated from the adjacent other photodetectors by, for example, disposing an element isolation region 200t in the semiconductor substrate 200, as illustrated in FIG. 11. The lower electrode 76 in each pixel Px is spatially separated from the lower electrodes 76 in adjacent other pixels Px and thereby is electrically isolated from the lower electrodes 76 in other pixels Px.

In contrast, the photoelectric conversion layer 74 and the upper electrode 72 may be formed over a plurality of the pixels Px. Complication of the manufacturing process can be avoided by forming the photoelectric conversion layer 74 and/or the upper electrode 72 as a single layer over the plurality of pixels Px. The upper electrode 72 formed as a single electrode over a plurality of the pixels Px can collectively supply a second bias voltage Vb2 to the upper electrodes 72 of the plurality of the pixels Px, while avoiding complication of wiring.

Photoelectric Conversion Layer

Typical examples of the photoelectric conversion layers 114P and 74 will now be described in detail. Herein, the photoelectric conversion layer 74 will be described as the example.

The material constituting the photoelectric conversion layer 74 is typically a semiconductor material. The photoelectric conversion layer 74 received light irradiation generates a pair of positive and negative charges therein. Herein, an organic semiconductor material is used as the material constituting the photoelectric conversion layer 74. The photoelectric conversion layer 74 contains, for example, tin naphthalocyanine represented by Formula (1) (hereinafter, may be simply referred to as "tin naphthalocyanine").

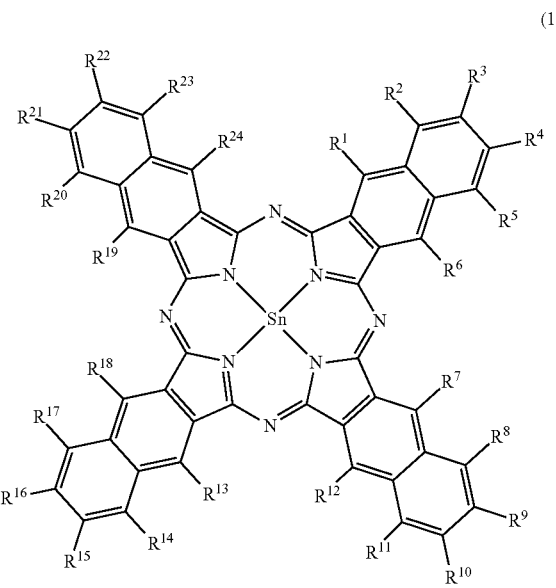

(1)

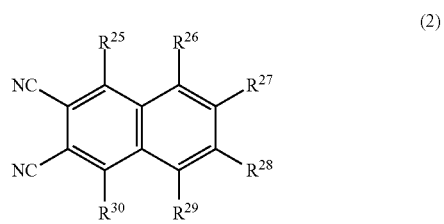

(2)

In the tin naphthalocyanine represented by Formula (1), advantageously at least eight of $R^1$ to $R^{24}$, more advantageously at least 16 of $R^1$ to $R^{24}$, and further advantageously all of $R^1$ to $R^{24}$ are hydrogen atoms or deuterium atoms, from the view point of ease of control of the aggregation state of molecules. Furthermore, the tin naphthalocyanine represented by Formula (3) is advantageous from the viewpoint of ease of synthesis.

(3)

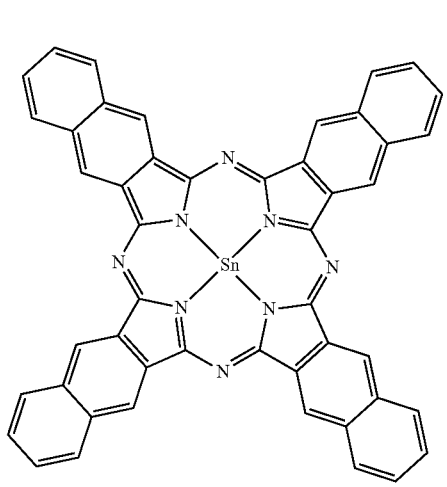

In Formula (1), $R^1$ to $R^{24}$ each independently represent a hydrogen atom or a substituent. The substituent is not particularly limited, and examples of the substituent include a deuterium atom, a halogen atom, an alkyl group (including a cycloalkyl group, a bicycloalkyl group, and a tricycloalkyl group), an alkenyl group (including a cycloalkenyl groups and a bicycloalkenyl group), an alkynyl group, an aryl group, a heterocyclic group, a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyl oxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents.

The tin naphthalocyanine represented by Formula (1) may be a commercially available product or can be synthesized using a naphthalene derivative represented by Formula (2) as a starting material as described in, for example, Japanese Unexamined Patent Application Publication No. 2010-232410. In Formula (2), $R^{25}$ to $R^{30}$ can be the same substituents as $R^1$ to $R^{24}$ in Formula (1).

Figure 12:
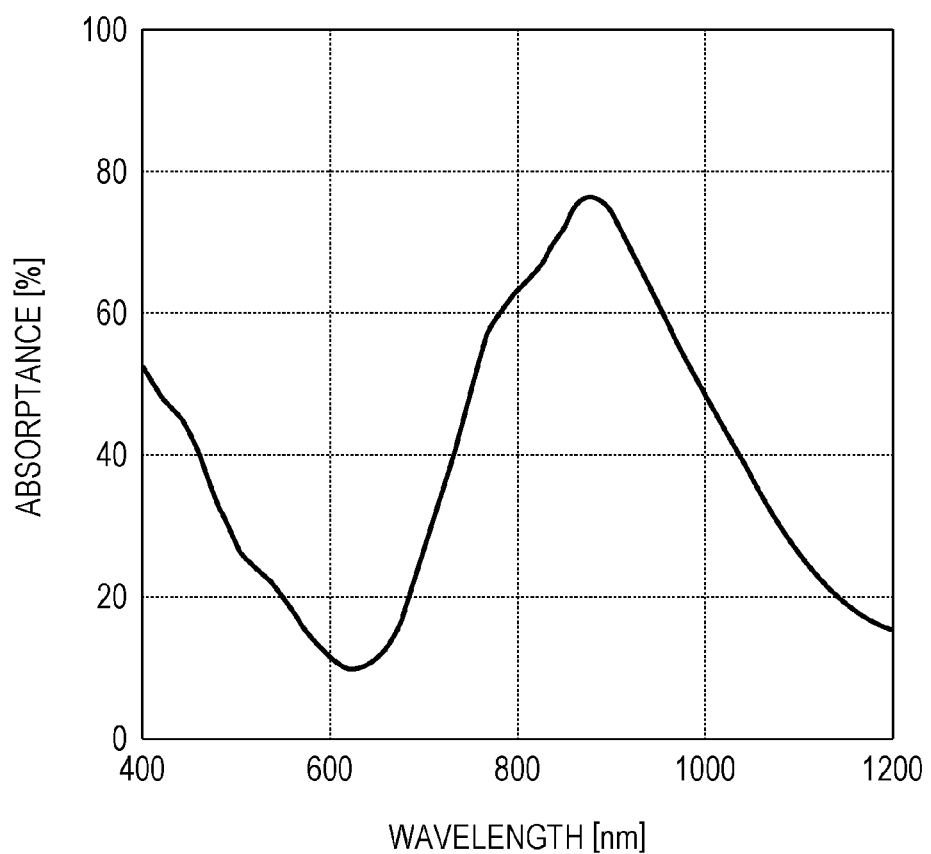
FIG. 12 is a graph showing an example of the absorption spectrum of a photoelectric conversion layer of a material containing tin naphthalocyanine.

The tin naphthalocyanine represented by Formula (1) has absorption in a wavelength band of about 200 nm or more and 1100 nm or less. For example, the tin naphthalocyanine represented by Formula (3) has an absorption peak at a wavelength of about 870 nm, as shown in FIG. 12. FIG. 12 shows an example of the absorption spectrum of a photoelectric conversion layer containing tin naphthalocyanine represented by Formula (3). Incidentally, the absorption spectrum is measured using a photoelectric conversion layer having a thickness of 30 nm placed on a quartz substrate.

As obvious from FIG. 12, a photoelectric conversion layer formed from a material containing tin naphthalocyanine has an absorption in a near-infrared region. That is, a photodetector capable of detecting near-infrared light can be achieved by selecting a material containing tin naphthalocyanine as the material constituting the photoelectric conversion layer 74.

Figure 13:
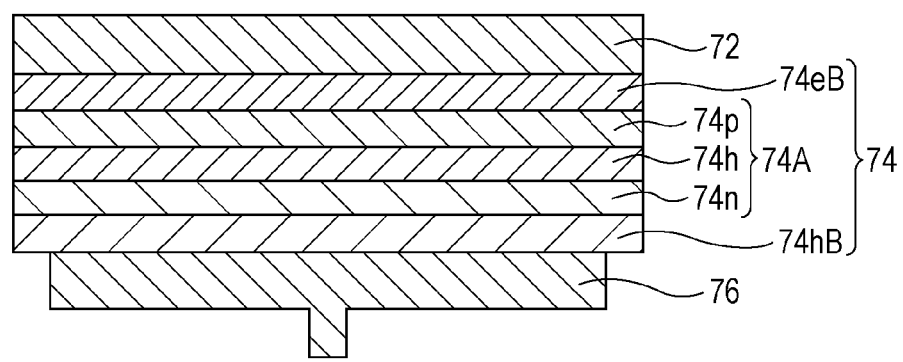
FIG. 13 is a cross-sectional view schematically illustrating an example of the structure of a photoelectric conversion layer.

FIG. 13 schematically illustrates an example of the structure of the photoelectric conversion layer 74. In the structure illustrated in FIG. 13, the photoelectric conversion layer 74 includes a hole-blocking layer 74hB, a photoelectric conversion laminate 74A formed of an organic semiconductor material containing tin naphthalocyanine represented by Formula (1), and an electron-blocking layer 74eB. The hole-blocking layer 74hB is disposed between the photoelectric conversion laminate 74A and the lower electrode 76, and the electron-blocking layer 74eB is disposed between the photoelectric conversion laminate 74A and the upper electrode 72.

The photoelectric conversion laminate 74A illustrated in FIG. 13 includes at least one of a p-type semiconductor and an n-type semiconductor. In the structure illustrated in FIG. 13, the photoelectric conversion laminate 74A includes a p-type semiconductor layer 74p, an n-type semiconductor layer 74n, and a mixed layer 74h between the p-type semiconductor layer 74p and the n-type semiconductor layer 74n. The p-type semiconductor layer 74p is disposed between the electron-blocking layer 74eB and the mixed layer 74h and has functions of photoelectric conversion and/or hole transport. The n-type semiconductor layer 74n is disposed between the hole-blocking layer 74hB and the mixed layer 74h and has functions of photoelectric conversion and/or electron transport. As described later, the mixed layer 74h may include at least one of a p-type semiconductor and an n-type semiconductor.

The p-type semiconductor layer 74p and the n-type semiconductor layer 74n contain an organic p-type semiconductor and an organic n-type semiconductor, respectively. That is, the photoelectric conversion laminate 74A includes an organic photoelectric conversion material containing tin naphthalocyanine represented by Formula (1) and at least one of an organic p-type semiconductor and an organic n-type semiconductor.

The organic p-type semiconductor is a donor organic semiconductor and refers to an organic compound mainly represented by a hole transporting organic compound and having a property of easily donating electrons. More specifically, the term "organic p-type semiconductor" refers to an organic compound having a smaller ionization potential when two organic compounds are used in contact with each other. Accordingly, the donor organic compound can be any organic compound having an electron-donating property. Examples of the donor organic compound include a thiophene compound, such as a triarylamine compound, a benzidine compound, a pyrazoline compound, a styrylamine compound, a hydrazone compound, a triphenylmethane compound, a carbazole compound, a polysilane compound, and P3HT; a phthalocyanine compound, such as copper phthalocyanine; a cyanine compound; a merocyanine compound; an oxonol compound; a polyamine compound; an indole compound; a pyrrole compound; a pyrazole compound; a polyarylene compound; a condensed aromatic carbocyclic compound (a naphthalene derivative, an anthracene derivative, a phenanthrene derivative, a tetracene derivative, a pyrene derivative, a perylene derivative, and a fluoranthene derivative); and a metal complex including a nitrogen-containing heterocyclic compound as a ligand. The donor organic semiconductor is not limited to these examples, and as described above, any organic compound having an ionization potential lower than that of the organic compound used as an n-type compound can be used as the donor organic semiconductor. The above-described tin naphthalocyanine is an example of the organic p-type semiconductor material.

The organic n-type semiconductor is an acceptor organic semiconductor and refers to an organic compound mainly represented by an electron transporting organic compound and having a property of easily receiving electrons. More specifically, the term "organic n-type semiconductor" refers to an organic compound having a higher electron affinity when two organic compounds are used in contact with each other. Accordingly, the acceptor organic compound can be any organic compound having an electron-receiving property. Examples of the acceptor organic compound include a fullerene derivative, such as fullerene and phenyl $C_{61}$ butyric acid methyl ester (PCBM); a condensed aromatic carbocyclic compound (e.g., a naphthalene derivative, an anthracene derivative, a phenanthrene derivative, a tetracene derivative, a pyrene derivative, a perylene derivative, and a fluoranthene derivative); 5- to 7-membered heterocyclic compounds containing nitrogen atoms, oxygen atoms, and sulfur atoms (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenazepine, and tribenzazepine); a polyarylene compound; a fluorene compound; a cyclopentadiene compound; a silyl compound; a perylenetetracarboxylic diimide compound (PTCDI); and a metal complex including a nitrogen-containing heterocyclic compound as a ligand. The acceptor organic semiconductor is not limited to these examples, and as described above, any organic compound having an electron affinity higher than that of the organic compound used as a p-type compound can be used as the acceptor organic semiconductor.

The mixed layer 74h can be, for example, a bulk heterojunction structure layer including a p-type semiconductor and an n-type semiconductor. In the case of forming the mixed layer 74h as a layer having a bulk heterojunction structure, the tin naphthalocyanine represented by Formula (1) can be used as the p-type semiconductor material. The n-type semiconductor material can be, for example, fullerene and/or a fullerene derivative. The bulk heterojunction structure is described in detail in Japanese Patent No. 5553727. For reference, the full disclosure of Japanese Patent No. 5553727 is incorporated herein by reference in its entirety.

Figure 14:
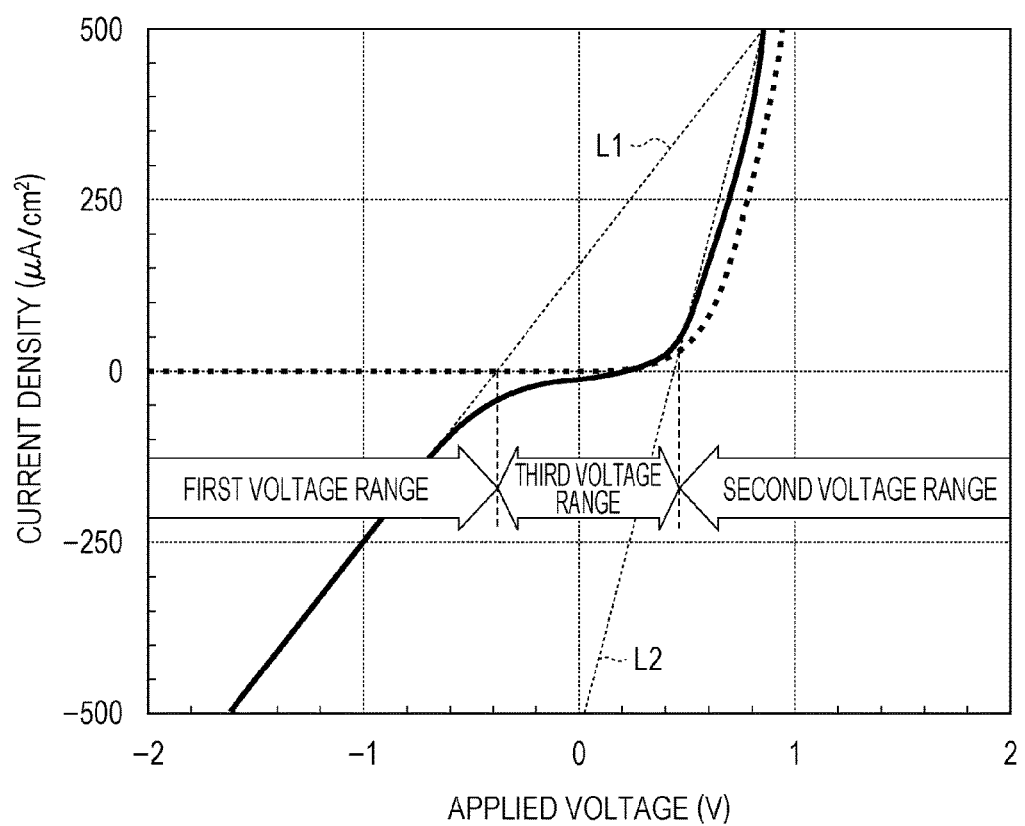
FIG. 14 is a graph showing a typical example of the photocurrent characteristics of a photoelectric conversion layer.

A photoelectric conversion structure having a sensitivity in a desired wavelength range can be achieved by using an appropriate material according to the wavelength range for detection. The material constituting the photoelectric conversion layer 74 is not limited to organic semiconductor materials and may include an inorganic semiconductor material such as amorphous silicon. The photoelectric conversion layer 74 may include a layer composed of an organic material and a layer composed of an inorganic material. An example of applying a bulk heterojunction structure prepared by codeposition of tin naphthalocyanine and $C_{60}$ to the photoelectric conversion laminate 74A will now be described. Typical example of photocurrent characteristics of photoelectric conversion layer FIG. 14 shows a typical example of the photocurrent characteristics of a photoelectric conversion layer 74. In FIG. 14, the graph of a thick solid line shows an exemplary current-voltage characteristics of a photoelectric conversion layer 74 under light irradiation. FIG. 14 also shows an example of the current-voltage characteristics when light is not irradiated by a thick broken line.

FIG. 14 shows a change in current density between the two main surfaces of the photoelectric conversion layer 74 when the bias voltage applied between the main surfaces is changed under a constant illuminance. In the specification, the forward direction and the reverse direction of a bias voltage are defined as follows. When the photoelectric conversion laminate 74A has a junction structure of a layered p-type semiconductor and a layered n-type semiconductor, a bias voltage such that the potential of the p-type semiconductor layer is higher than that of the n-type semiconductor layer is defined as a forward bias voltage. In contrast, a bias voltage such that the potential of the p-type semiconductor layer is lower than that of the n-type semiconductor layer is defined as a reverse bias voltage. In the case of using an organic semiconductor material, the forward direction and the reverse direction can be defined as in the case of using an inorganic semiconductor material. In the case in which the whole photoelectric conversion laminate 74A has a bulk heterojunction structure, the forward direction and the reverse direction of a bias voltage are defined between the photoelectric conversion layer 74 and the electrode in contact with the photoelectric conversion layer 74. Specifically, among the HOMO and LUMO levels of the organic material contained in the photoelectric conversion laminate 74A, a level having the smallest energy difference from the Fermi level of the electrode material constituting the electrode is selected. The bias voltage to be applied to an electrode such that an electron or a hole is easily injected into the selected level is the forward direction, and the bias voltage to be applied to an electrode such that an electron or a hole is hardly injected into the selected level is the reverse direction. For example, when the LUMO level of the acceptor in the photoelectric conversion laminate 74A is the level having the smallest energy difference with respect to the Fermi level of the electrode material, it is a state where an electron is easily injected into the photoelectric conversion laminate 74A. In this case, a positive voltage applied to the electrode being in contact with the photoelectric conversion layer 74 is a reverse bias voltage, and a negative voltage is a forward bias voltage.

As shown in FIG. 14, the photocurrent characteristics of the photoelectric conversion layer according to the embodiment of the present disclosure are roughly characterized by three first to third voltage ranges. The first voltage range is a reverse bias voltage range and is a voltage range in which the absolute value of the output current density increases with an increase in the reverse direction bias voltage. The first voltage range may be a voltage range in which the photocurrent increases with an increase in the bias voltage applied between the main surfaces of the photoelectric conversion layer. The second voltage range is a forward bias voltage range and is a voltage range in which the output current density increases with an increase in the forward direction bias voltage. That is, the second voltage range is a voltage range in which the forward direction current increases with an increase in the bias voltage applied between the main surfaces of the photoelectric conversion layer. The third voltage range is a voltage range between the first voltage range and the second voltage range.

The first to third voltage ranges can be distinguished from one another by the slope of a graph showing the photocurrent characteristics when linear vertical and horizontal axes are used. For reference, in FIG. 14, the average slopes of the first voltage range and the second voltage range in the graph are respectively shown by a broken line L1 and a broken line L2. As shown in FIG. 14, the rates of change in the output current density with respect to the increase in the bias voltage in the first voltage range, the second voltage range, and the third voltage range are different from one another. The third voltage range is defined as a voltage range in which the rate of change in the absolute value of the output current density with respect to the bias voltage is smaller than those in the first voltage range and the second voltage range. Alternatively, the third voltage range may be determined based on the positions of rising or falling in the graph showing the current-voltage characteristics. In the third voltage range, the current density between the main surfaces of the photoelectric conversion layer hardly changes even if the bias voltage is changed. As described in detail later, in the third voltage range, the positive and negative charge pairs generated by light irradiation promptly recombine and disappear by stopping the light irradiation. Accordingly, a fast response can be achieved by controlling the bias voltage applied between the two main surfaces of the photoelectric conversion layer during operation of the photodetector within the third voltage range.

In the embodiment of the present disclosure, during operation, light detection is performed in the state in which the potential difference between the impurity region 212 and the upper electrode 72 or the transparent gate electrode 112 is maintained, for example, within the third voltage range. In other words, photoelectric conversion structure 110A generates a current corresponding to a change in the dielectric constant of the photoelectric conversion layer 114P between the impurity region 212 and the impurity region 214 in the state in which the potential difference between the impurity region 212 and the transparent gate electrode 112 is maintained, for example, within the third voltage range. Similarly, the photoelectric conversion structure 110B generates a current corresponding to a change in the dielectric constant of the photoelectric conversion layer 74 between the impurity region 212 and the impurity region 214 in the state in which the potential difference between the impurity region 212 and the upper electrode 72 is maintained, for example, within the third voltage range.

That is, the voltage supply circuit 51 connected to the first voltage line 11 and the second voltage line 12, at the time of detecting light, supplies a first bias voltage Vb1 and a second bias voltage Vb2 such that the potential difference applied between both main surfaces of the photoelectric conversion layer 114P or the photoelectric conversion layer 74 is maintained, for example, within the third voltage range. The difference between the first bias voltage Vb1 and the second bias voltage Vb2 can be, for example, about 0.1 V. For example, in the case of using the photoelectric conversion structure 110B, the voltage supply circuit 51 is constituted such that the second bias voltage Vb2 that falls within the third voltage range when the potentials of the impurity region 212 is regarded as a standard is applied to the upper electrode 72 via the second voltage line 12.

As described above, the current density between the main surfaces of the photoelectric conversion layer hardly changes, even if the bias voltage is changed, if the bias voltage applied between the main surfaces is within the third voltage range. In other words, charge exchange hardly occurs between the photoelectric conversion layer and the electrode adjacent to the photoelectric conversion layer. This is caused by that the generated positive and negative charges form a dipole without separating and moving to an electrode, and the generated positive charge and negative charge themselves are not extracted to the outside of the photoelectric conversion layer. Accordingly, it is possible to effectively use the positive and negative charge pairs generated by photoelectric conversion for changing the dielectric constant of the photoelectric conversion layer and to generate a current between the impurity region 212 and the impurity region 214 corresponding to the change in the dielectric constant.

Thus, in the embodiment described above, at the time of detecting light, a bias voltage that falls within the third voltage range when the potential of the impurity region 212 is regarded as a standard is applied to the photoelectric conversion layer 74 or the photoelectric conversion layer 114P. In contrast, in existing photosensors using photodiodes or photoelectric conversion films, in general, operation of photodetection is carried out under a reverse bias corresponding to the first voltage range shown in FIG. 14. Accordingly, holes and electrons generated by photoelectric conversion move toward the cathode and the anode of the photodiode, respectively. In photodetection of known photosensors, the charges generated by photoelectric conversion are extracted to an external circuit as signals.

The discharge of charges from the photoelectric conversion layer and the inflow of charges into the photoelectric conversion layer take about several tens milliseconds. Thus, the speed is slow. Accordingly, when the photosensor is applied to an image sensor, a structure involving discharge of charges from the photoelectric conversion layer or inflow of charges into the photoelectric conversion layer has a risk of occurrence of, for example, noise or afterimage, by the voltage application or light irradiation to the photoelectric conversion layer at the start of imaging. In the structure of a typical embodiment of the present disclosure in which the bias voltage applied to the photoelectric conversion layer at the time of detecting light is, for example, within the third voltage range, since such discharge of charges from the photoelectric conversion layer or inflow of charges into the photoelectric conversion layer is not caused, occurrence of noise, afterimage, etc. can be suppressed. In addition, in the state in which a bias voltage within the third voltage range is applied, positive and negative charge pairs recombine in a short period of time of about several tens microseconds or less and disappear by stopping the light incidence on the photoelectric conversion layer. Accordingly, in the above-described embodiment, a fast response can be achieved. Since a fast response can be achieved, the photodetector according to the embodiment of the present disclosure is advantageous for application to, for example, distance measurement by a time-of-flight method or ultrahigh-speed photographing.

The device structure illustrated in FIG. 11 is seemingly similar to the device structure of a layered image sensor in which a photoelectric conversion layer is disposed on a semiconductor substrate. However, in the layered image sensor, a bias voltage is applied between a pixel electrode and a transparent electrode facing the pixel electrode, and one of the positive charges and the negative charges generated in the photoelectric conversion layer by light irradiation is collected as signal charges by a pixel electrode. The collected signal charges are temporarily stored in the floating diffusion of an imaging cell, and the signal voltage corresponding to the amount of the stored charges is read out at a predetermined timing.

Figure 15:
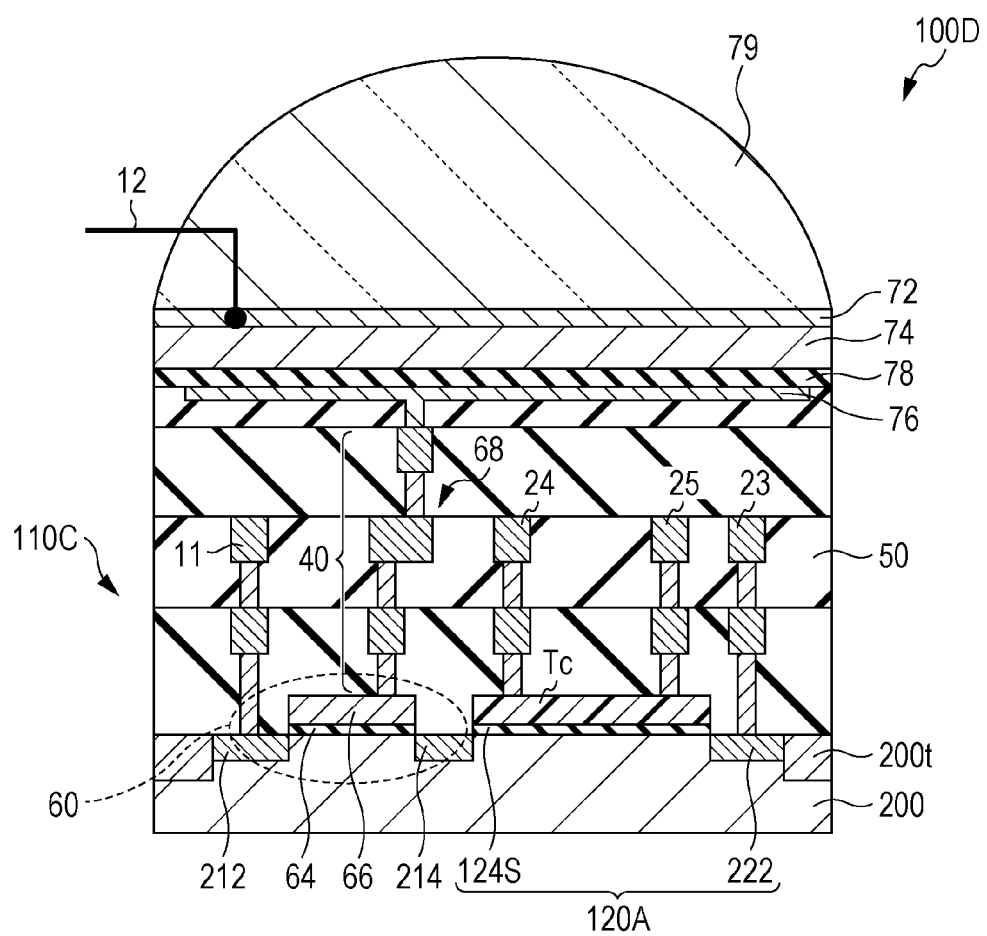
FIG. 15 is a cross-sectional view schematically illustrating another modification example of the photodetector of the present disclosure.

In contrast, in the photoelectric conversion structures 110A and 110B of the present disclosure, the positive and negative charges generated in the photoelectric conversion layer are not moved toward electrodes, and an electric signal corresponding to a change in the dielectric constant of the photoelectric conversion layer is read out. Although the layered image sensor uses, as signal charges, only one of the positive charges and the negative charges, the photoelectric conversion structures 110A and 110B use positive and negative charges, in a pair form, for a change in the current between the impurity region 212 and the impurity region 214 and can therefore achieve a higher sensitivity. In addition, since the potential difference applied between the upper surface and the lower surface of the photoelectric conversion layer is the potential difference of the third voltage range, the generated charge pairs promptly recombine by stopping the light irradiation. That is, unlike the layered image sensor, operation corresponding to the reset of the potential of a pixel electrode is not needed. Other modification example FIG. 15 illustrates a modification example of the photodetector of the present disclosure. The photodetector 100D illustrated in FIG. 15 has a photoelectric conversion structure 110C instead of the photoelectric conversion structure 110B of the photodetector 100C described with reference to FIG. 11. A difference between the photoelectric conversion structure 110B illustrated in FIG. 11 and the photoelectric conversion structure 110C of the photodetector 100D is that the photoelectric conversion structure 110C further includes an insulating layer 78 between the photoelectric conversion layer 74 and the lower electrode 76.

As in this example, for example, it is possible to apply a larger potential difference between the impurity region 212 and the upper electrode 72 by disposing an insulating layer 78 between the photoelectric conversion layer 74 and the lower electrode 76. For example, during operation of the photodetector 100D, light may be detected in a state in which a bias voltage within the first voltage range is applied between the impurity region 212 and the upper electrode 72. In such a case, it can be structured such that the voltage supply circuit 51 applies a second bias voltage Vb2 that falls within the first voltage range when the potential of the impurity region 212 is regarded as a standard, to the upper electrode 72 via the second voltage line 12. It may be structured such that the voltage supply circuit 51 can supply a voltage that falls within the first voltage range and a voltage that falls within the third voltage range, when the impurity region 212 is regarded as a standard, by converting between them.

In the state in which a bias voltage within the first voltage range is applied to the photoelectric conversion layer 74, the insulating layer 78 between the photoelectric conversion layer 74 and the lower electrode 76 can function as a capacitor storing one of the positive charges and the negative charges generated by photoelectric conversion. The storage of charges in the capacitor causes electrostatic induction in the junction 68 to change the effective gate voltage in the field effect transistor 60, resulting in a change in the threshold of the field effect transistor 60. After the completion of reading out of output signals, for example, the charges stored in the insulating layer 78 as a capacitor can be reset by applying a voltage having a polarity opposite to the second bias voltage Vb2 to the upper electrode 72.

Instead of disposing the insulating layer 78 between the photoelectric conversion layer 74 and the lower electrode 76 or in addition to disposing the insulating layer 78 between the photoelectric conversion layer 74 and the lower electrode 76, an insulating layer may be disposed between the photoelectric conversion layer 74 and the upper electrode 72. The material constituting the insulating layer 78 can be, for example, a material having a leakage current smaller than that of the material constituting the photoelectric conversion layer 74, such as a silicon oxide film. The insulating layer 78 may be, for example, a silicon nitride film or an aluminum oxide film.

As described above, according to the embodiment of the present disclosure, photodetection in a desired time window is possible. Each of the signal detection transistor 42, the address transistor 44, the reset transistor 46, and the field effect transistor 60 may be N-channel MOS transistors or may be P-channel MOS transistors. These transistors need not be unified to N-channel MOS transistors or P-channel MOS transistors.

A structure in which holes are used as signal charges instead of electrons may be employed. Signal charges can be satisfactorily separated into two adjacent charge storages by using holes having relatively low mobility. That is, signal charges are suppressed from mixing into a charge storage adjacent to the proper charge storage into which the signal charges should be transferred.

The photodetector of the present disclosure can be applied to, for example, an image sensor. The photodetector of the present disclosure can detect visible light and/or infrared light by appropriately selecting the material for the photoelectric conversion layer and is useful for distance measurement using infrared light and for obtaining images using visible light and infrared light, for example. The photodetector of the present disclosure can be used in, for example, a digital camera, a security camera, a medical camera, and a camera mounted on a vehicle. The vehicle-mounted camera can be used as an input into a control device for, for example, safe driving of the vehicle or can be used for supporting an operator for safe driving of the vehicle.

What is claimed is:

1. A photodetector comprising:
a semiconductor substrate including a first impurity region and a second impurity region;
a gate insulating layer located on a region of the semiconductor substrate, the region being between the first impurity region and the second impurity region, the gate insulating layer including a photoelectric conversion layer;
a gate electrode located on the gate insulating layer and having a light-transmitting property;
a first charge transfer channel transferring signal charges corresponding to a current occurring between the first impurity region and the second impurity region depending on a change in a dielectric constant of the photoelectric conversion layer caused by light incidence on the photoelectric conversion layer;
a second charge transfer channel diverging from the first charge transfer channel;
a first charge storage storing charges, among the signal charges, transferred via the second charge transfer channel; and
a first gate switching transfer and shutdown of charges passing through the second charge transfer channel.

2. The photodetector according to claim 1, wherein the gate insulating layer includes an insulating layer between the photoelectric conversion layer and the semiconductor substrate.

3. The photodetector according to claim 1, further comprising:
a light shielding film between the gate electrode and the semiconductor substrate.

4. The photodetector according to claim 1, wherein the photoelectric conversion layer has a photocurrent characteristic between a bias voltage applied to the photoelectric conversion layer and an current density of a current flowing through the photoelectric conversion layer, the photocurrent characteristic including a first voltage range where an absolute value of the current density increases as the bias voltage increases in a reverse direction, a second voltage range where the current density increases as the bias voltage increases in a forward direction, and a third voltage range where an absolute value of a rate of change of the current density relative to bias voltage is less than in the first voltage range and the second voltage range, the third voltage range being between the first voltage range and the second voltage range.

5. The photodetector according to claim 4, further comprising:
a voltage supply circuit supplying a voltage that falls within the third voltage range when a voltage of the first impurity region is regarded as a standard, to the gate electrode, wherein
the current occurs between the first impurity region and the second impurity region in a state where a potential difference between the first impurity region and the gate electrode is maintained within the third voltage range.

6. The photodetector according to claim 4, further comprising:
a voltage supply circuit, wherein
the voltage supply circuit supplies a voltage to the gate electrode such that a bias voltage that falls within the third voltage range is applied to the photoelectric conversion layer; and
the current occurs between the first impurity region and the second impurity region in a state where the bias voltage applied to the photoelectric conversion layer is maintained within the third voltage range.

7. The photodetector according to claim 1, further comprising:
a voltage supply circuit, wherein
the semiconductor substrate includes a third impurity region;
one end of the first charge transfer channel is connected to the second impurity region, and the other end of the first charge transfer channel is connected to the third impurity region; and
the voltage supply circuit supplies a voltage different from a voltage of the first impurity region to the third impurity region.

8. The photodetector according to claim 1, further comprising:
a third charge transfer channel diverging from the first charge transfer channel; and
a second charge storage storing charges, among the signal charges, transferred via the third charge transfer channel.

9. The photodetector according to claim 8, further comprising:
a second gate switching transfer and shutdown of charges passing through the third charge transfer channel, wherein
the first gate and the second gate each independently switch transfer and shutdown of charges.

10. A photodetector comprising:
a semiconductor substrate including a first impurity region and a second impurity region;
a gate insulating layer located on a region of the semiconductor substrate, the region being between the first impurity region and the second impurity region;
a gate electrode on the gate insulating layer;
a first electrode electrically connected to the gate electrode;
a second electrode facing the first electrode and having a light-transmitting property;
a photoelectric conversion layer between the first electrode and the second electrode;
a first charge transfer channel transferring signal charges corresponding to a current occurring between the first impurity region and the second impurity region depending on a change in a dielectric constant between the first electrode and the second electrode caused by light incidence on the photoelectric conversion layer;

a second charge transfer channel diverging from the first charge transfer channel;

a first charge storage storing charges, among the signal charges, transferred via the second charge transfer channel; and a first gate switching transfer and shutdown of charges passing through the second charge transfer channel.

11. The photodetector according to claim 10, wherein the photoelectric conversion layer has a photocurrent characteristic between a bias voltage applied to the photoelectric conversion layer and an current density of a current flowing through the photoelectric conversion layer, the photocurrent characteristic including a first voltage range where an absolute value of the current density increases as the bias voltage increases in a reverse direction, a second voltage range where the output current density increases as the bias voltage increases in a forward direction, and a third voltage range where an absolute value of a rate of change of the current density relative to bias voltage is less than in the first voltage range and the second voltage range, the third voltage range being between the first voltage range and the second voltage range.

12. The photodetector according to claim 11, further comprising:

a voltage supply circuit supplying a voltage that falls within the third voltage range when a voltage of the first impurity region is regarded as a standard, to the second electrode, wherein the current occurs between the first impurity region and the second impurity region in a state where a potential difference between the first impurity region and the second electrode is maintained within the third voltage range.

13. The photodetector according to claim 11, further comprising:

a voltage supply circuit, wherein the voltage supply circuit supplies a voltage to the second electrode such that a bias voltage that falls within the third voltage range is applied to the photoelectric conversion layer; and the current occurs between the first impurity region and the second impurity region in a state where the bias voltage applied to the photoelectric conversion layer is maintained within the third voltage range.

14. The photodetector according to claim 10, further comprising:

a first insulating layer between the first electrode and the photoelectric conversion layer and/or a second insulating layer between the photoelectric conversion layer and the second electrode.

15. The photodetector according to claim 14, further comprising:

a voltage supply circuit supplying a voltage that falls within the first voltage range when a voltage of the first impurity region is regarded as a standard, to the second electrode, wherein the current occurs between the first impurity region and the second impurity region in a state where a potential difference between the first impurity region and the second electrode is maintained within the first voltage range.

16. The photodetector according to claim 10, wherein the first electrode has a light-shielding property.

17. The photodetector according to claim 10, further comprising:

a junction connecting between the gate electrode and the first electrode.

18. The photodetector according to claim 10, further comprising:

a third charge transfer channel diverging from the first charge transfer channel; and a second charge storage storing charges, among the signal charges, transferred via the third charge transfer channel.

19. The photodetector according to claim 18, further comprising:

a second gate switching transfer and shutdown of charges passing through the third charge transfer channel, wherein the first gate and the second gate each independently switch transfer and shutdown of charges.

20. The photodetector according to claim 10, further comprising:

a voltage supply circuit, wherein the semiconductor substrate includes a third impurity region;

one end of the first charge transfer channel is connected to the second impurity region, and the other end of the first charge transfer channel is connected to the third impurity region; and the voltage supply circuit supplies a voltage different from a voltage of the first impurity region to the third impurity region.

* * * * *